(12) United States Patent
Shizuno

(10) Patent No.: US 7,521,807 B2
(45) Date of Patent: Apr. 21, 2009

(54) SEMICONDUCTOR DEVICE WITH INCLINED THROUGH HOLES

(75) Inventor: Yoshinori Shizuno, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 8 days.

(21) Appl. No.: 11/526,697

(22) Filed: Sep. 26, 2006

(65) Prior Publication Data

US 2007/0096330 A1    May 3, 2007

(30) Foreign Application Priority Data

Sep. 30, 2005    (JP) .............................. 2005-289267

(51) Int. Cl.
- H01L 23/48    (2006.01)
- H01L 23/52    (2006.01)
- H01L 29/40    (2006.01)
- H01L 23/02    (2006.01)
- H01L 23/34    (2006.01)

(52) U.S. Cl. ........................ 257/774; 257/621; 257/678; 257/680; 257/685; 257/686; 257/698; 257/723; 257/730; 257/737; 257/738; 257/773; 257/777; 257/778; 257/780; 257/E21.597

(58) Field of Classification Search ................ 257/678, 257/680, 685–686, 698, 723, 730, 737–738, 257/773–774, 777–778, 780, 621, E21.597
See application file for complete search history.

(56) References Cited

U.S. PATENT DOCUMENTS

| | | | | |
|---|---|---|---|---|
| 6,015,985 | A * | 1/2000 | Ho et al. ...................... | 257/301 |
| 6,191,487 | B1 * | 2/2001 | Rodenbeck et al. ......... | 257/778 |
| 6,617,682 | B1 * | 9/2003 | Ma et al. ..................... | 257/706 |
| 6,873,054 | B2 | 3/2005 | Miyazawa et al. | |
| 6,917,102 | B2 * | 7/2005 | Zhou et al. .................. | 257/698 |
| 6,943,419 | B2 * | 9/2005 | Wong et al. ................. | 257/416 |
| 7,436,068 | B2 * | 10/2008 | Hirata et al. ................ | 257/774 |
| 2003/0119308 | A1 * | 6/2003 | Geefay et al. ............... | 438/640 |
| 2006/0046475 | A1 * | 3/2006 | Wark et al. .................. | 438/667 |
| 2006/0054910 | A1 * | 3/2006 | Takemori et al. ............. | 257/98 |

FOREIGN PATENT DOCUMENTS

| | | | | |
|---|---|---|---|---|
| JP | | 56054066 A | * | 5/1981 |
| JP | | 58034967 A | * | 3/1983 |
| JP | | 2003-318178 | | 11/2003 |
| JP | | 2003-347502 | | 12/2003 |

* cited by examiner

Primary Examiner—Ida M Soward
(74) Attorney, Agent, or Firm—Rabin & Berdo, P.C.

(57) ABSTRACT

A semiconductor device has a semiconductor substrate with an inclined through hole extending between its two major surfaces in a peripheral part of the substrate, providing an electrical interconnection between the two surfaces. The opening of the inclined through hole on the first major surface, on which electronic components are formed, is closer to the edge of the substrate than is the opening on the second major surface. Reliability is therefore enhanced because cracks forming at the edge of the second major surface are less likely to propagate to the through hole. An electrically conductive path in the through hole is formable by spraying conductive material onto its inner wall, using an ink-jet system.

17 Claims, 18 Drawing Sheets

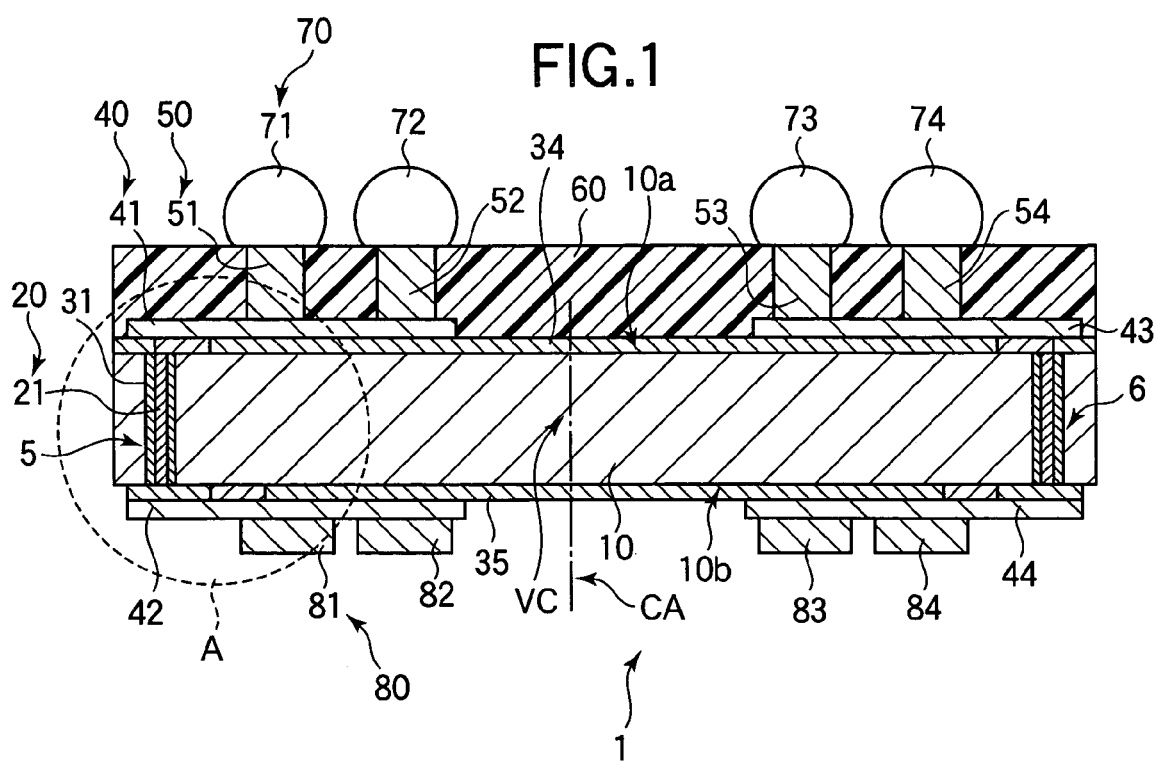
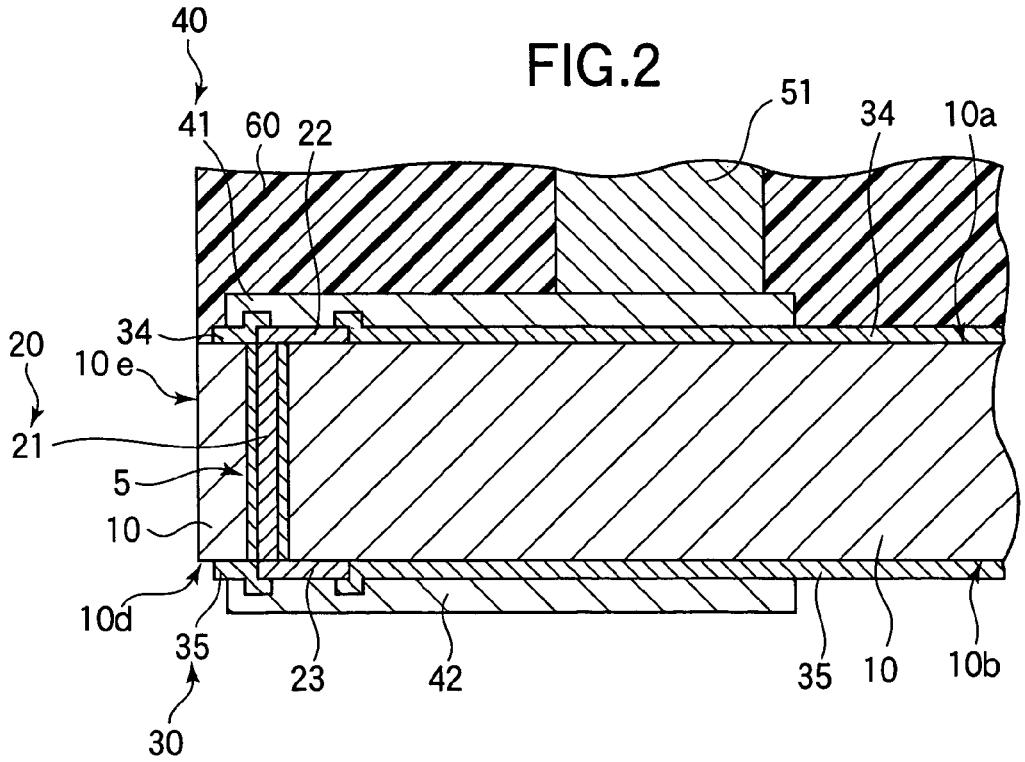

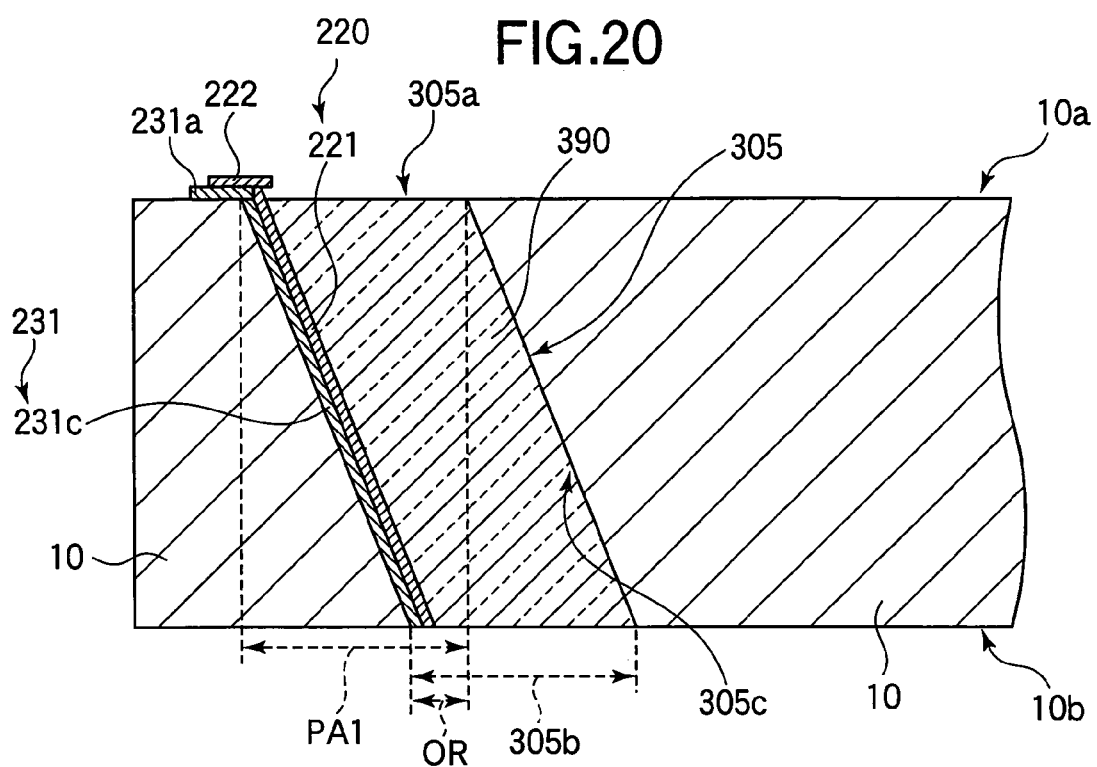
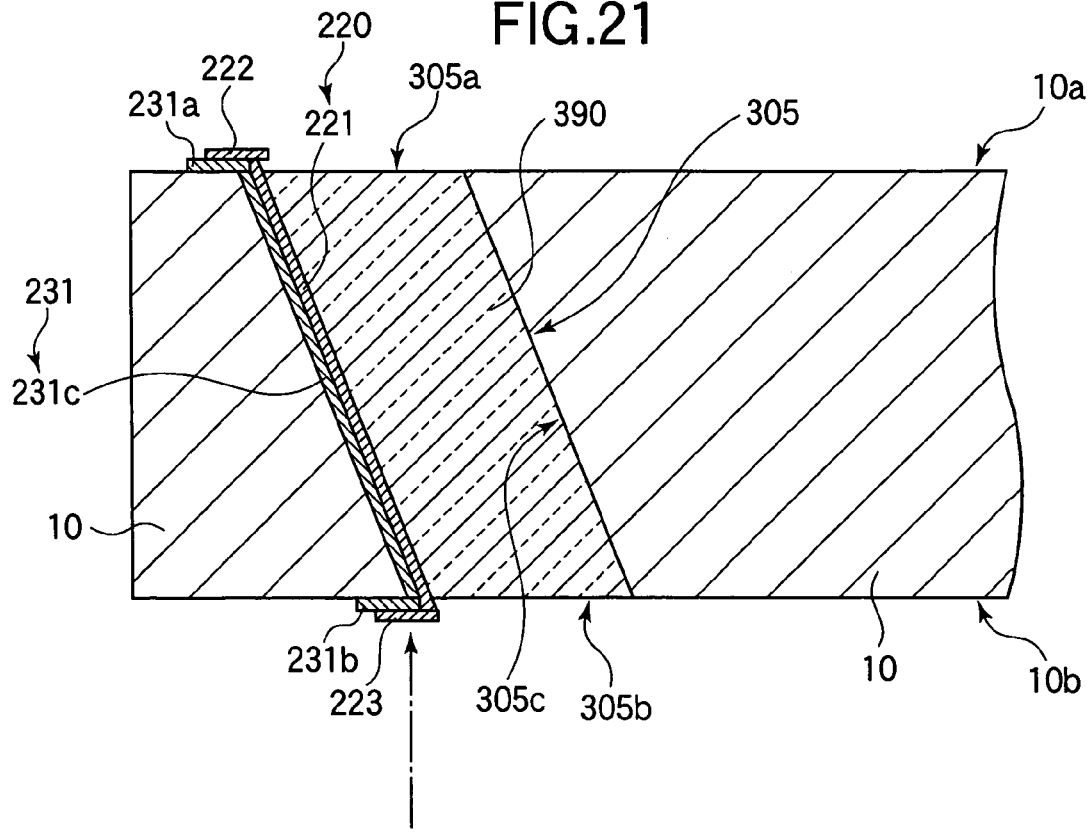

SEMICONDUCTOR DEVICE WITH INCLINED THROUGH HOLES

BACKGROUND OF THE INVENTION

1. Field of the Invention

The present invention relates to a semiconductor device and its fabrication method.

2. Description of the Related Art

Semiconductor devices having a substrate with through holes extending between the upper and lower surfaces to provide electrical connections therebetween have been proposed in, for example, Japanese Patent Application Publications No. 2003-318178 (pp. 1 to 5, FIGS. 1 to 8) and No. 2003-347502 (pp. 1 to 7, FIGS. 1 to 9).

The technology disclosed in the first of these Publications tapers the through holes in the depth direction. Consequently, if the through holes extend from the upper surface of the semiconductor device, where its functional components are formed, to the lower surface, the comparatively large openings on the upper surface reduce the space available for forming components. The circuit designer is therefore forced to use a semiconductor substrate with a comparatively large die size, making the semiconductor device comparatively expensive. If the through holes extend from the lower surface to the upper surface this problem can be avoided, but then the comparatively large openings of the holes on the lower surface come uncomfortably close to the edges of the lower surface, where cracks can easily form. If a crack propagates inward from an edge of the lower surface to a nearby through hole, the reliability of the through hole is impaired.

The technology disclosed in the second of the above Publications places the through holes in the peripheral areas of the semiconductor device, and angles the holes in a direction parallel to the adjacent edge of the device. There is consequently the same problem of proximity of the holes to the edges of the device on its lower surface and impaired reliability due to crack propagation from those edges to the through holes.

SUMMARY OF THE INVENTION

An object of the present invention is to enhance the reliability of through holes in a semiconductor device.

The invented semiconductor device has a semiconductor substrate with a first surface, a second surface, and an edge extending therebetween. The first and second surfaces are both substantially orthogonal to a central axis passing through the center of volume of the semiconductor substrate. Electronic circuit components are formed on the first surface. A through hole extends from the first surface to the second surface in a peripheral part of the semiconductor substrate inwardly adjacent to the edge. The through hole is separated from the central axis by a distance that diminishes as the through hole approaches the second surface.

The distance from the edge of the semiconductor substrate to the through hole thus increases as the through hole approaches the second surface. Cracks forming at the edge of the second surface are therefore less likely to propagate to the through hole, and the reliability of the through hole is enhanced accordingly.

The invention also provides a method of fabricating a semiconductor device, comprising:

preparing a semiconductor substrate having a center of volume, a central axis passing through the center of volume, a first surface extending substantially orthogonal to the central axis, a second surface extending substantially orthogonal to the central axis, an edge extending substantially parallel to the central axis from the first surface to the second surface, and a peripheral part inwardly adjacent to the edge;

forming electronic circuit components on the first surface of the semiconductor substrate;

forming an inclined hole in the peripheral part, extending from the first surface toward the second surface, separated from the central axis by a distance that diminishes as the inclined hole approaches the second surface; and polishing the second surface to expose the inclined hole, so that the inclined hole extends from the first surface to the polished second surface.

The inclined hole is preferably separated from the edge of the semiconductor substrate by a distance that increases as the inclined hole approaches the second surface.

Forming the inclined hole may further comprise directing a laser beam at an oblique angle onto the first surface.

The inclined hole preferably originates in a first opening on the first surface and terminates in a second opening on the polished second surface, and has an inner wall extending from the first opening to the second opening, in which case the method further comprises:

forming a first dielectric layer extending continuously from the first surface to the polished second surface on at least part of the inner wall of the inclined hole, passing through at least part of a geometric projection formed by projecting the first opening parallel to the central axis onto the inner wall; and forming a conductive layer on the first dielectric layer, extending continuously from the first surface to the polished second surface, passing through at least part of said geometric projection.

In this case, the first dielectric layer is preferably formed by using an ink-jet system to spray dielectric material onto at least a part of the geometric projection; and the conductive layer is preferably formed by using the ink-jet system to spray conductive material onto at least a part of the geometric projection.

The fabrication method in this case may further comprise forming a second dielectric layer on the first dielectric layer and the conductive layer, thereby filling in the inclined hole.

BRIEF DESCRIPTION OF THE DRAWINGS

In the attached drawings:

FIG. 1 is a sectional view of a conventional semiconductor device;

FIG. 2 is an enlarged sectional view of part A in FIG. 1;

FIGS. 19, 20, and 21 are sectional views illustrating steps in a fabrication method for the semiconductor device in FIG. 17.

DETAILED DESCRIPTION OF THE INVENTION

Figure 3:
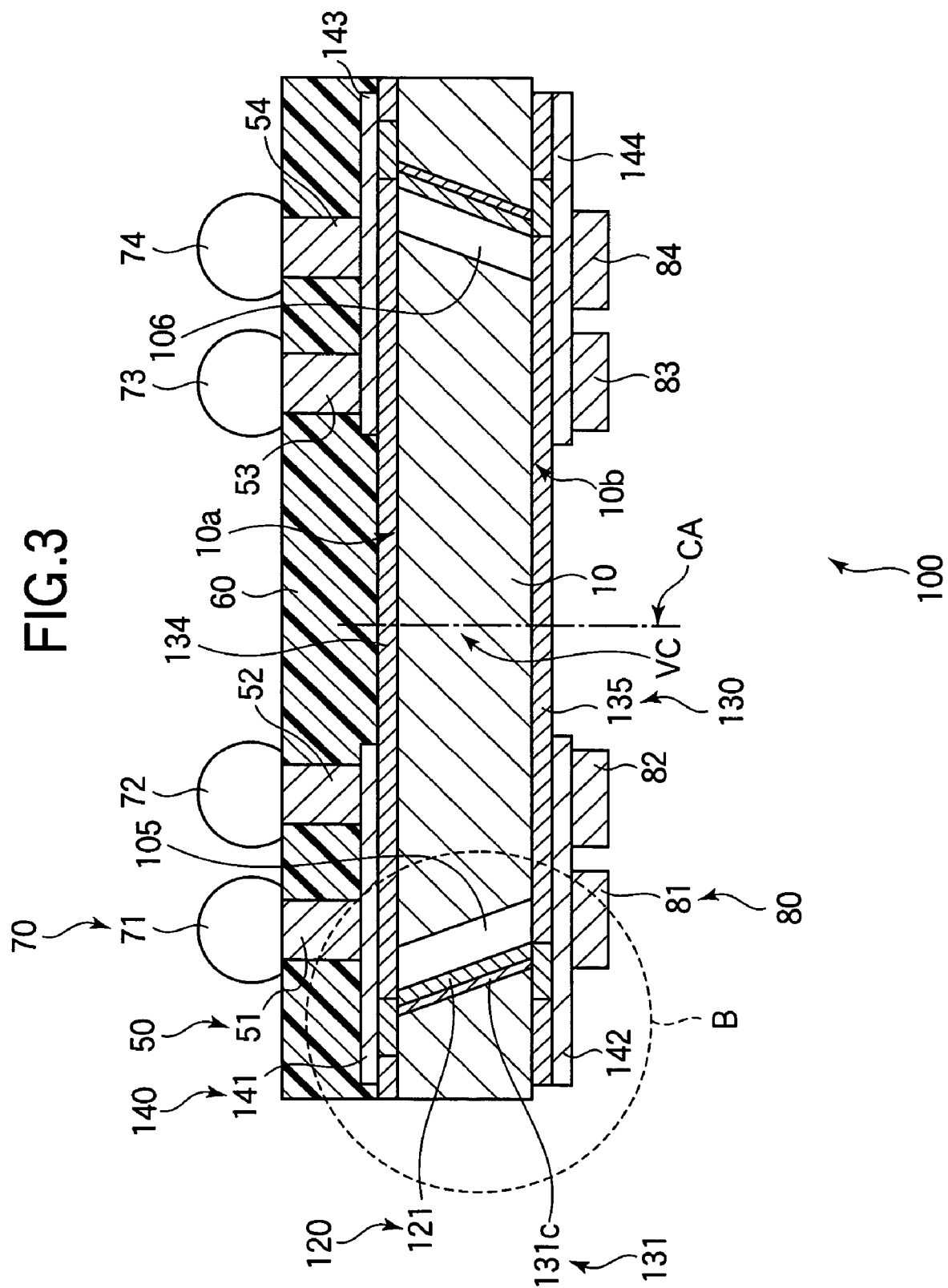
FIG. 3 is a sectional view of a semiconductor device in a first embodiment of the invention.

Embodiments of the invention will now be described with reference to the attached drawings, in which like elements are indicated by like reference characters. A conventional semiconductor device will also be described for comparison.

Conventional Device

Referring to FIG. 1, the conventional device, referred to as having a wafer level chip size package, comprises chiefly a semiconductor chip 10 with through holes 5, 6, . . . , conductive layers 20, first, third, and fourth dielectric layers 31, 34, 35, redistribution wiring 40 including a first layer (41, 43, . . . ) and a second layer (42, 44, . . . ), an array of metal posts 50 (51, 52, 53, 54, . . . ), a sealing layer 60, an array of solder balls 70 (71, 72, 73, 74, . . . ), and an array of lands 80 (81, 82, . . . ).

The semiconductor chip 10 has an upper surface 10a and a lower surface 10b, both of which are substantially orthogonal to a central axis CA passing through the center of volume VC of the semiconductor chip 10. Electronic circuit components (not shown) are formed on the upper surface 10a.

The third dielectric layer 34 extends across the upper surface 10a of the semiconductor chip 10. The first layer of redistribution wiring 41, 43, . . . extends parallel to the upper surface 10a of the semiconductor chip 10 on the surface of the third dielectric layer 34 distant from the semiconductor chip 10. Accordingly, the first layer of redistribution wiring 41, 43, . . . is not electrically shorted with the semiconductor chip 10.

The fourth dielectric layer 35 extends across the lower surface 10b of the semiconductor chip 10. The second layer of redistribution wiring 42, 44, . . . extends parallel to the lower surface 10b of the semiconductor chip 10 on the side of the fourth dielectric layer 35 distant from the semiconductor chip 10. Accordingly, the second layer of redistribution wiring 42, 44, . . . is not electrically shorted with the semiconductor chip 10.

The through holes 5, 6, . . . extend from the upper surface 10a of the semiconductor chip 10 to the lower surface 10b extend from the upper surface 10a to the lower surface 10b in a peripheral part of the semiconductor chip 10 inwardly adjacent to its edges. The through holes 5, 6, . . . extend substantially parallel to the central axis CA of the semiconductor chip 10, each through hole maintaining a substantially constant separation from the central axis CA throughout its length. The through holes 5, 6, . . . are filled with interconnecting wiring 21 belonging to the conductive layers 20 and with material belonging to the first dielectric layer 31.

The conductive layers 20 include the interconnecting wiring 21 filling the through holes and other conductive layers, shown in more detail in FIG. 2, that make electrical contact with the redistribution wiring 40.

The metal posts 50 electrically connect the first layer of redistribution wiring 41, 43, . . . to the solder balls 70. The lands 80 are connected to the second layer of redistribution wiring 42, 44, . . . . Both the solder balls 70 and lands 80 can be used to conduct external signals to and from the semiconductor device 1.

More specifically, the metal posts 50 and first layer of redistribution wiring 41, 43, . . . conduct signals between the solder balls 70 and the electronic circuitry disposed on the upper surface 10a of the semiconductor chip 10. The first layer of redistribution wiring 41, 43, . . . , conductive layers 20, and second layer of redistribution wiring 42, 44, . . . conduct signals between the electronic circuitry and the lands 80 on the lower surface 10b.

Signals supplied to the solder balls 70 on one side of the semiconductor chip 10 can also be transmitted directly through the semiconductor chip 10 to the lands 80 on the other side, and vice versa. For example, a signal supplied to solder ball 71 may be transmitted through metal post 51 and redistribution wiring 41, conductive layers 20, and redistribution wiring 42 to land 81. Similarly, a signal supplied to land 82 may be transmitted through redistribution wiring 42, conductive layers 20, redistribution wiring 41, and metal post 52 to solder ball 72.

Accordingly if a plurality of semiconductor devices 1 are stacked one atop another so that the solder balls 70 of one semiconductor device make contact with the lands 80 of the next semiconductor device 1, external signals can be conducted through the stack and supplied to any or all of its constituent semiconductor devices.

The sealing layer 60 is formed of, for example, a resin material that covers the third dielectric layer 34 and first layer of redistribution wiring 41, 43, . . . and insulates the metal posts 51, . . . from each other. The sealing layer 60 also cushions the electronic circuit components from external mechanical shock.

Referring to FIG. 2, the conductive layers 20 comprise chiefly the interconnecting wiring 21, first electrodes 22, and second electrodes 23. In a cross-sectional view parallel to the central axis CA, the interconnecting wiring 21 and the first and second electrodes 22, 23 have a segmented channel shape. More specifically, each first electrode 22 parallels the upper surface 10a of the semiconductor chip 10; each second electrode 23 parallels to the lower surface 10b of the semiconductor chip 10; the interconnecting wiring 21 extends in the direction in which the through holes 5, . . . extend through the semiconductor chip 10 to interconnect the first and second electrodes 22, 23. Each first electrode 22 is connected to the first layer of redistribution wiring 41; each second electrode 23 is connected to the second layer of redistribution wiring 42.

The first dielectric layer 31 is interposed between the interconnecting wiring 21 and the semiconductor chip 10. Accordingly, the interconnecting wiring 21 is not electrically shorted to the semiconductor chip 10.

The conductive layers 20 combine to conduct signals between the first layer of redistribution wiring 41, . . . and the second layer of redistribution wiring 42, . . . as explained above. For example, when a signal is supplied to redistribution wiring 41 from an electronic circuit component on the top surface 10a of the semiconductor chip 10 or through metal post 51, the signal is transmitted to redistribution wiring 42 through first electrode 22, interconnecting wiring 21, and second electrode 23 in FIG. 2. When a signal is supplied to redistribution wiring 42, the signal is transmitted to redistribution wiring 41 through second electrode 23, interconnecting wiring 21, and first electrode 22 in FIG. 2.

Semiconductor chips 10 as shown in FIGS. 1 and 2 are fabricated from a semiconductor wafer (not shown). The term 'wafer level chip scale package' is commonly applied when the redistribution wiring 40, metal posts 50, sealing layer 60, solder balls 70, and lands 80 are formed while the semiconductor chips 10 are still part of the semiconductor wafer. The same term or the shorter term 'chip scale package' may be applied when some or all of these elements are formed after the wafer has been diced into individual chips.

In a conventional method of fabricating the semiconductor device in FIGS. 1 and 2, first a semiconductor wafer (not shown) is prepared. In this step, the semiconductor wafer includes the semiconductor chip 10, the upper surface 10a, and an initial lower surface lower than the lower surface 10b shown in FIGS. 1 and 2.

Electronic circuit components (not shown) are formed on the upper surface 10a of the semiconductor wafer. For example, transistor source and drain areas and gate electrodes are formed.

The through holes 5, . . . are formed by directing a laser beam onto the upper surface 10a of the semiconductor wafer in a direction parallel to the central axis CA. The through holes 5, . . . extend from the upper surface 10a to a depth greater than the distance between the upper surface 10a and lower surface 10b shown in FIGS. 1 and 2, but do not extend to the initial lower surface.

The initial lower surface of the semiconductor wafer is then polished to form the lower surface 10b, the depth of which is less than the depth of the through holes 5, . . . , so that the through holes 5, . . . extend from the upper surface 10a to the polished lower surface 10b.

Next, the first dielectric layer 31 is formed, coating the inner walls of the through holes 5, . . . in a substantially cylindrical shape so that the inner part of the first dielectric layer 31 is a cavity extending from an upper opening to a lower opening.

The conductive layers 20 are then formed. The inner cavity of the first dielectric layer 31 is filled in with interconnecting wiring 21 by an electroplating process. The first and second electrodes 23 are formed by sputtering deposition, and make electrical contact with the interconnecting wiring 21.

The third and fourth dielectric layers 34, 35 are formed on the upper and lower surfaces 10a, 10b of the semiconductor chip 10 by chemical vapor deposition (CVD). The third dielectric layer 34 is formed as a protective coating to protect the electronic circuit components. After the third and fourth dielectric layers 34, 35 have been formed, the redistribution wiring 40, the metal posts 50, and the lands 80 are formed, the resin layer is applied to the third dielectric layer 34 to form the sealing layer 60, and the solder balls 70 are formed.

After at least the third and fourth dielectric layers 34, 35 have been formed, the lower surfaces 10b of the semiconductor chips 10 are attached to a dicing tape, and the semiconductor chips 10 are diced from the semiconductor wafer by a dicing saw that cuts along the edges 10e of the chips.

As a result of the dicing cut, cracks may form in a semiconductor chip 10. Cracks tend to start from the edge 10d of the lower surface 10b of the semiconductor chip 10 and propagate inward, in a direction that brings them closer to the center of volume VC (FIG. 1). If a crack propagates to a through hole 5, the first dielectric layer 31 and the interconnecting wiring 21 therein may be damaged: the interconnecting wiring 21 may become shorted with the semiconductor chip 10, or the electrical continuity of the interconnecting wiring 21 may be broken. Since the through holes 5, . . . are close to the edges 10d of the lower surface 10b, this is not an unusual occurrence. The conventional chip design thus compromises the yield of the fabrication process and the reliability of the through holes 5, . . . in the field.

Another problem is that since the interconnecting wiring 21 in the through holes 5, . . . is formed by an electroplating technique, porosities may form in the interconnecting wiring 21, impairing its electrical reliability. It is often difficult to find electroplating conditions that avoid this problem.

First Embodiment

The semiconductor device in the first embodiment will be described with reference to FIGS. 3 to 9, focusing on the differences from the conventional semiconductor device.

Referring to FIG. 3, the semiconductor device 100 in the first embodiment has through holes 105, 106, . . . , conductive layers 120, first, third, and fourth dielectric layers 131, 134, 135, and redistribution wiring 140 that differ in various aspects from the through holes 5, 6, . . . , conductive layers 20, dielectric layers 31, 34, 35, and redistribution wiring 40 of the conventional semiconductor device 1.

The third dielectric layer 134 extends across the upper surface 10a of the semiconductor chip 10. The first layer of redistribution wiring 141, 143, . . . extends parallel to the upper surface 10a of the semiconductor chip 10 on the surface of the third dielectric layer 134 distant from the semiconductor chip 10. The patterning of the third dielectric layer 134 and the patterning of the first layer of redistribution wiring 141, 143, . . . differ slightly from the patterning in the conventional semiconductor device 1. In particular, these layers 134, 141, 143, . . . may be patterned so as to leave the through holes 105, 106, . . . uncovered, as will be shown later.

The fourth dielectric layer 135 extends across the lower surface 10b of the semiconductor chip 10. The second layer of redistribution wiring 142, 144, . . . extends parallel to the lower surface 10b of the semiconductor chip 10 on the side of the fourth dielectric layer 135 distant from the semiconductor chip 10. The patterning of the fourth dielectric layer 135 and the patterning of the second layer of redistribution wiring 142, 144, . . . differ significantly from the patterning in the conventional semiconductor device 1.

The through holes 105, 106, . . . extend at an inclined angle from the upper surface 10a to the lower surface 10b in a peripheral part of the semiconductor chip 10 inwardly adjacent to its edge. More specifically, the through holes 105, 106, . . . are separated from the central axis CA by a distance that diminishes as the through holes approach the lower surface 10b. If, for example, the distance between the upper surface 10a of the semiconductor chip 10 and the lower surface 10b is fifty micrometers (50 µm), and the inner diameter of one of the through holes 105, . . . is 30 µm to 50 µm, then the through holes 105, . . . are preferably inclined at an angle of 25 degrees to 45 degrees with respect to the direction parallel to the central axis CA.

Figure 4:
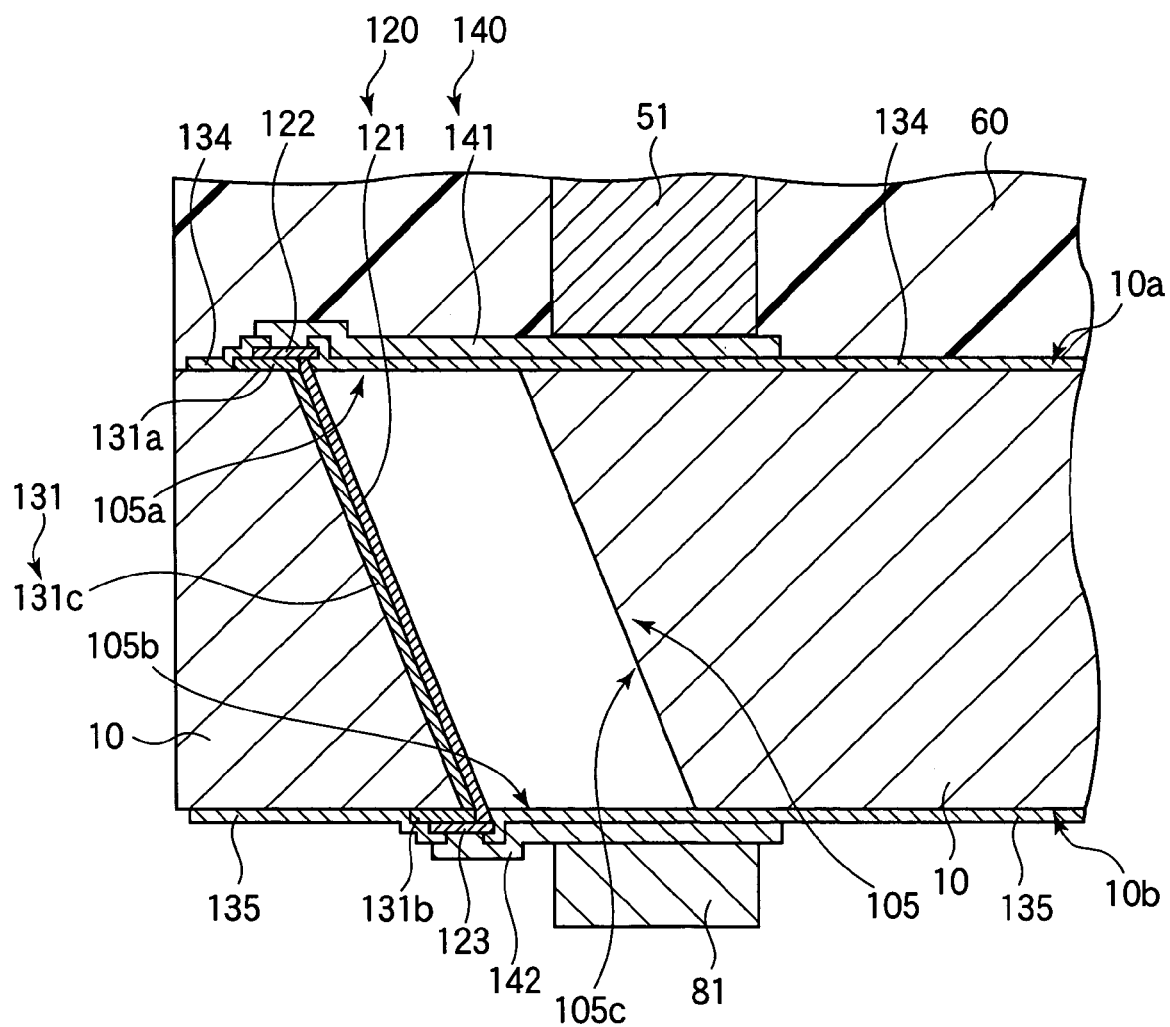
FIG. 4 is an enlarged sectional view of part B in FIG. 3.

Referring to FIG. 4, each of the through holes 105, . . . comprises chiefly a first opening 105a, a second opening 105b, and an inner wall 105c. Due to the inclined orientation of the through holes, the inner wall 105c is separated from the edge of the semiconductor chip 10 by a distance that increases as the inner wall 105c approaches the lower surface 10b.

The conductive layers 120 comprise interconnecting wiring 121, first electrodes 122, and second electrodes 123, that differ in location from the conventional interconnecting wiring 21, first electrodes 22, and second electrodes 23, although the general segmented channel shape is maintained. The interconnecting wiring 121 extends through each through hole 105, . . . from the upper surface 10a to the lower surface 10b of the semiconductor chip 10, but covers only part of the inside wall of each through hole 105, . . . , the covered part being a part that faces generally toward the edge of the semiconductor chip 10. The distance from the edge of the semiconductor chip 10 to the interconnecting wiring 121 increases as the interconnecting wiring 121 approaches the lower surface 10b. Each first electrode 122 parallels the upper surface 10a of the semiconductor chip 10; each second electrode 123 parallels the lower surface 10b of the semiconductor chip 10.

The first electrodes 122 connect the interconnecting wiring 121 to the first layer of redistribution wiring 141, . . . ; the second electrodes 123 connect the interconnecting wiring 121 to the second layer of redistribution wiring 142, . . . .

The first dielectric layer 131 is interposed between the conductive layers 120 and the semiconductor chip 10. The first dielectric layer 131 comprises chiefly a first electrode insulating layer 131a, a second electrode insulating layer 131b, and an interconnecting wiring insulating layer 131c. The first electrode insulating layer 131a is interposed between the first electrodes 122 and the semiconductor chip 10. Accordingly, the first electrodes 122 are not electrically shorted to the semiconductor chip 10. The second electrode insulating layer 131b is interposed between the second electrodes 123 and the semiconductor chip 10. Accordingly, the second electrodes 123 are not electrically shorted to the semiconductor chip 10. The interconnecting wiring insulating layer 131c is interposed between the interconnecting wiring 121 and the semiconductor chip 10. Accordingly, the interconnecting wiring 121 is not electrically shorted to the semiconductor chip 10.

When a signal is supplied from metal post 51 through redistribution wiring 141 to the first electrode 122 in FIG. 4, the signal is transmitted from the first electrode 122 through the interconnecting wiring 121 to the second electrode 123 and thus to redistribution wiring 142. When a signal is supplied from land 81 through redistribution wiring 142 to the second electrode 123 in FIG. 4, the signal is transmitted from the second electrode 123 through the interconnecting wiring 121 to the first electrode 122, and thus to redistribution wiring 141. Signals can be therefore transmitted between the first-layer of redistribution wiring 141, . . . and the second layer of redistribution wiring 142, . . . through the conductive layers 120.

A method of fabricating the semiconductor device in FIGS. 3 and 4 will now be described with reference to FIGS. 5 to 8.

The steps of preparing a semiconductor wafer and forming electronic circuit components are the same as the corresponding steps in the method of fabricating the conventional semiconductor device 1. The initial lower surface of the wafer will be denoted by reference characters 10c.

Figure 5:
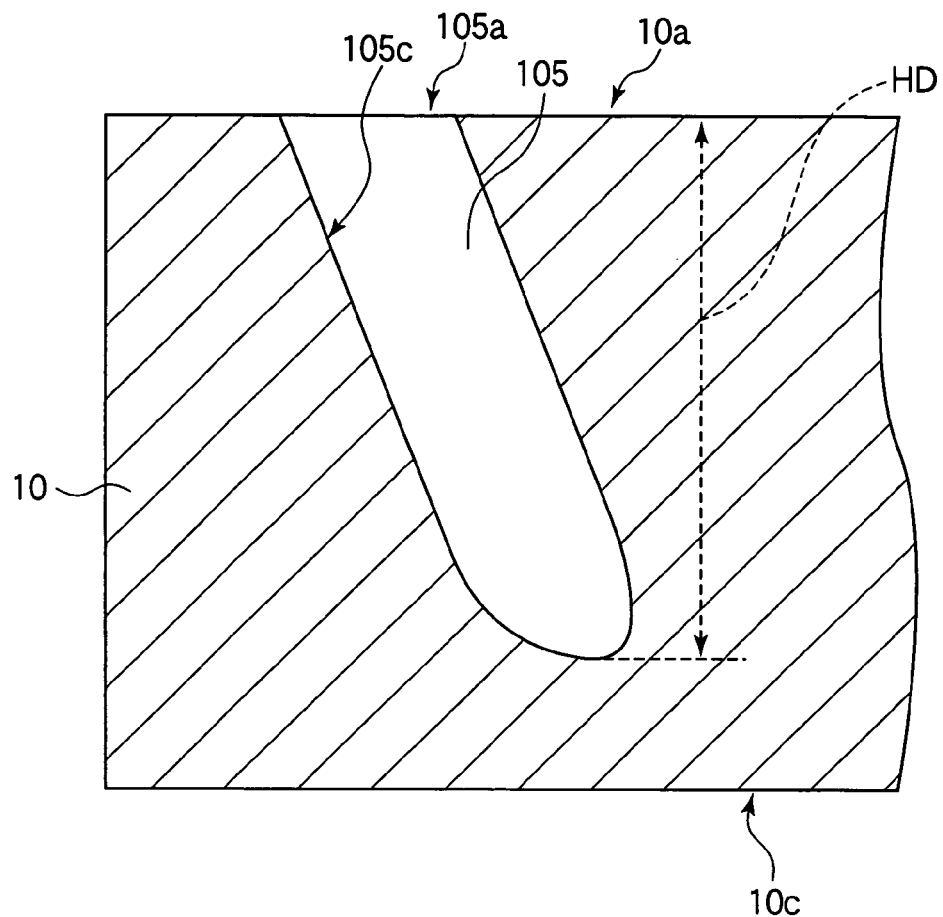
FIGS. 5, 6, 7, and 8 are sectional views illustrating steps in a fabrication method for the semiconductor device in FIG. 3.

The through holes 105, . . . are formed as shown in FIG. 5 by directing a laser beam at an oblique angle onto the upper surface 10a of the semiconductor wafer. In this step, the through holes 105, . . . extend from the upper surface 10a to a depth HD less than the distance to the initial lower surface 10c.

Figure 6:
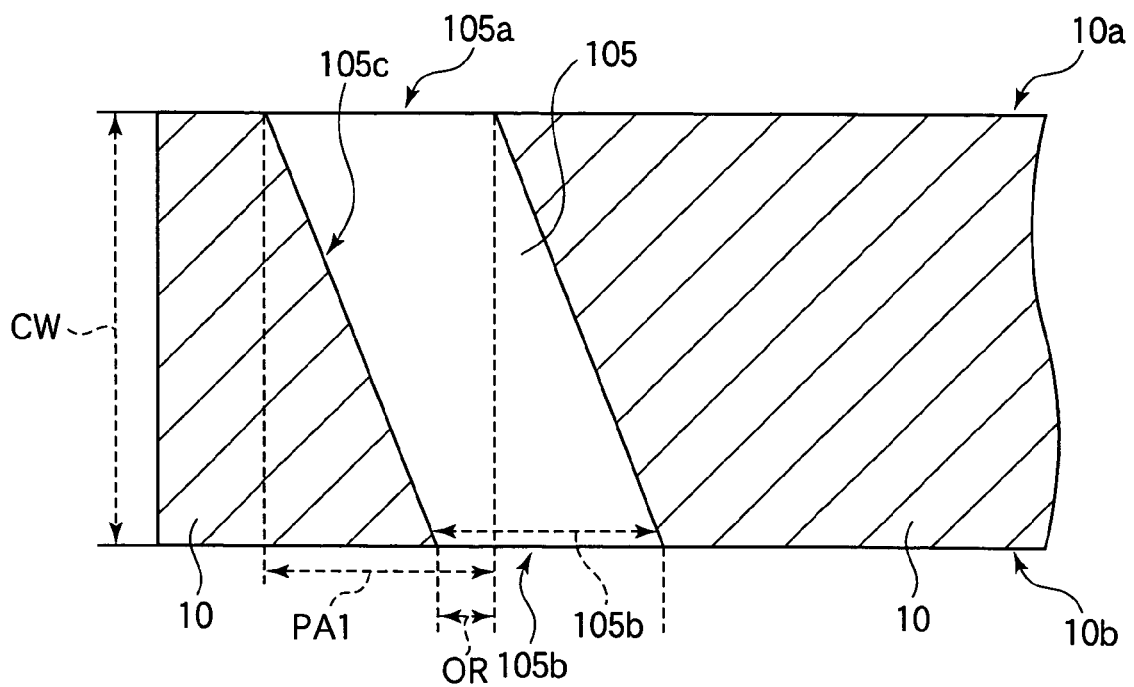

The initial lower surface 10c of the semiconductor wafer is now polished as in FIG. 6 to form the lower surface 10b that was shown in FIGS. 3 and 4. The distance CW between the upper surface 10a and lower surface 10b is less than the depth HD of the through holes in FIG. 5 (CW<HD), so the through holes 105, . . . extend from the upper surface 10a to the polished lower surface 10b. The through holes 105, . . . are also separated from the edges of the semiconductor chip 10 by a distance that increases as the through holes 105, . . . approach the lower surface 10b. Accordingly, if a first geometric projection PA1 is formed by projecting the first opening 105a onto the lower surface 10b parallel to the central axis of the semiconductor chip 10, the first geometric projection PA1 is generally closer to the edge of the semiconductor chip 10 than is the second opening 105b. Part of a first geometric projection PA1, however, overlaps part of the second opening 105b. The overlap is designated by the reference characters OR. Accordingly, the first opening 105a is disposed partially directly over the second opening 105b in a direction parallel to the central axis of the semiconductor chip 10.

Figure 7:
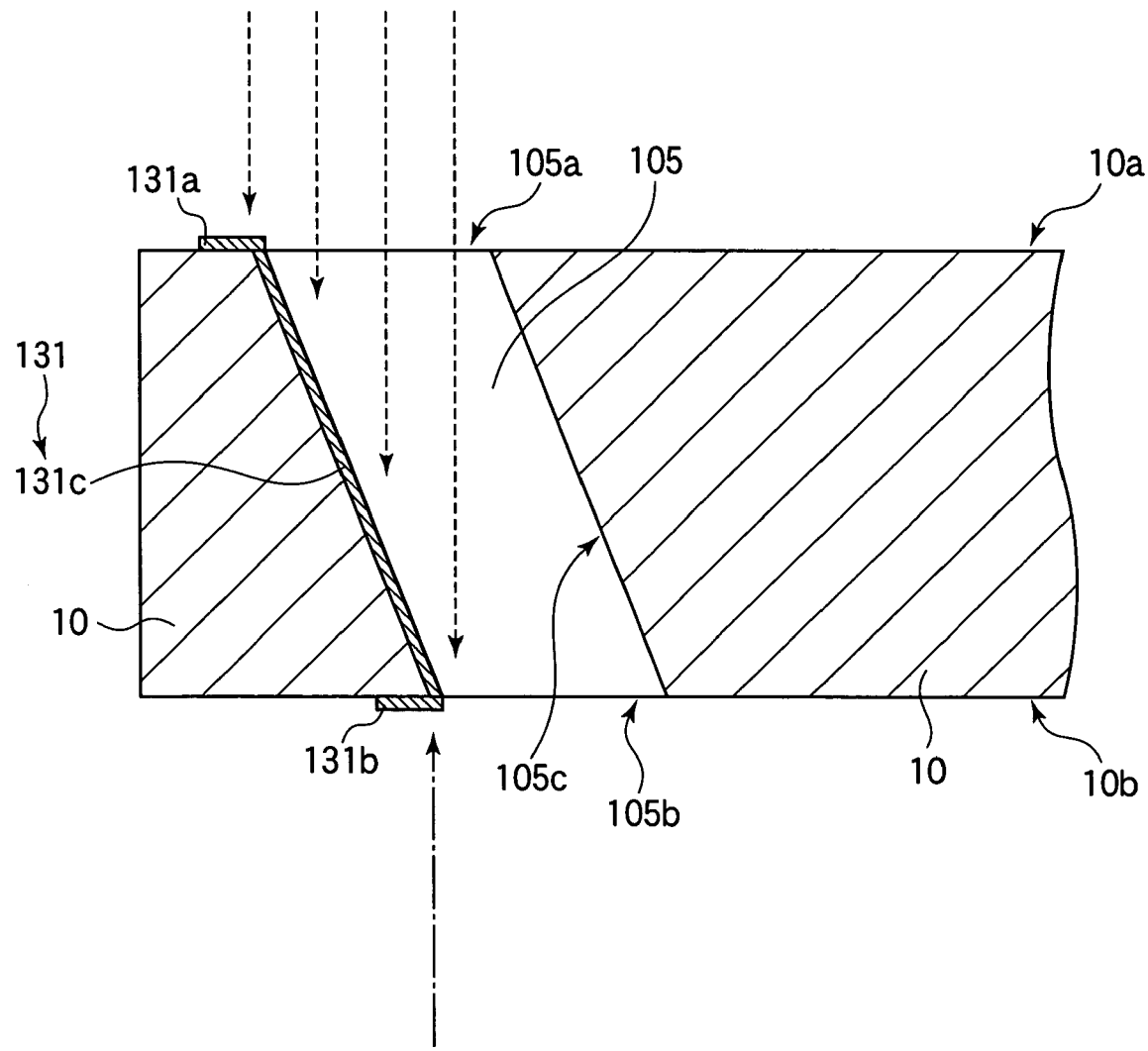

The first dielectric layer 131 is formed as shown in FIG. 7. The first electrode insulating layer 131a and the interconnecting wiring insulating layer 131c are formed by using an ink-jet system to spray dielectric material, as indicated by dashed arrows, onto the upper surface 10a and part of the inner wall 105c of each through hole 105 in a direction parallel to the central axis of the semiconductor chip 10. The second electrode insulating layer 131b is formed by using an ink-jet system to spray dielectric material onto the lower surface 10b as indicated by a dash-dotted arrow, also in the direction parallel to the central axis of the semiconductor chip 10.

Figure 8:
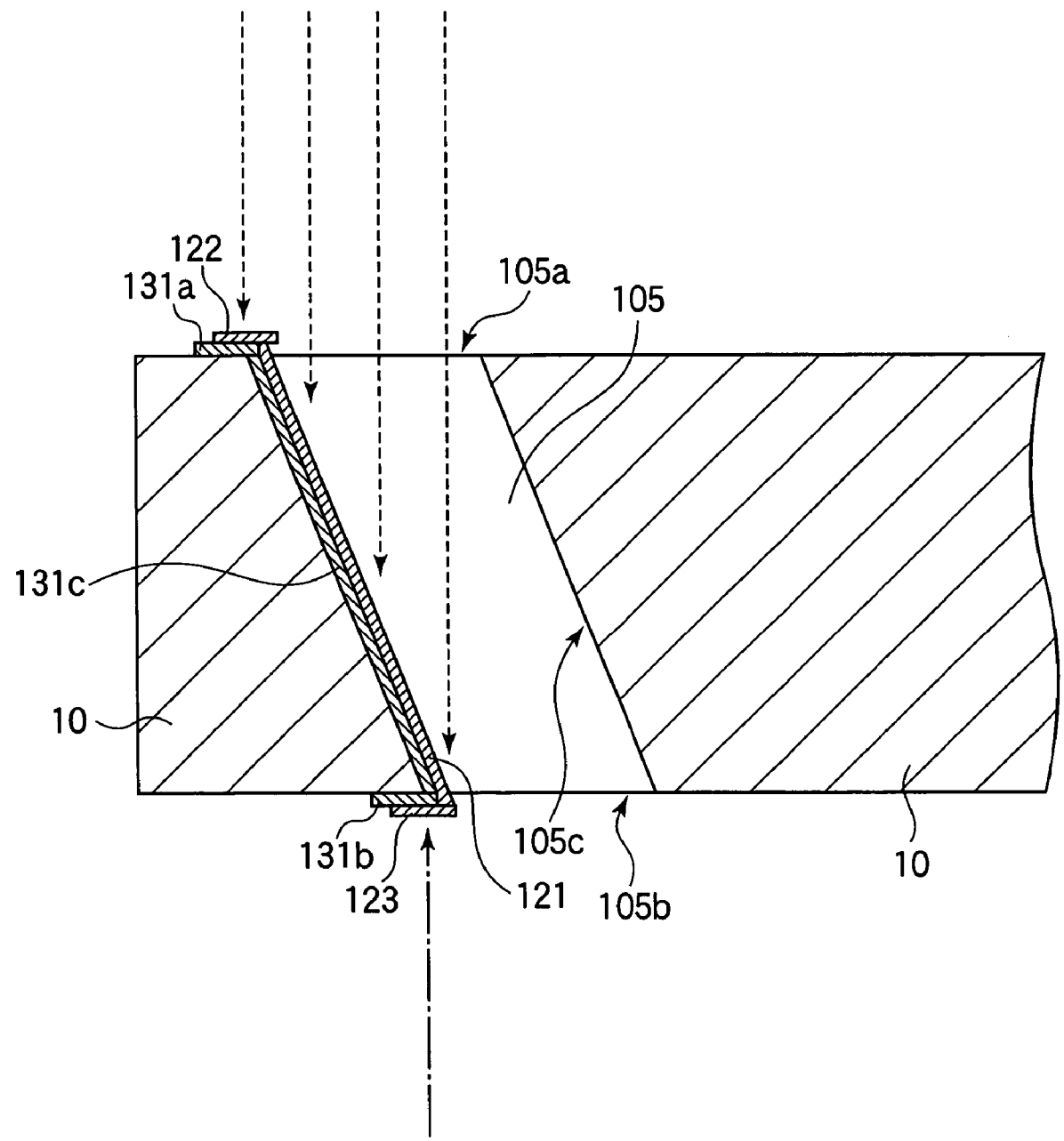

The conductive layers 120 are formed as shown in FIG. 8. The first electrode 122 and the interconnecting wiring 121 are formed by using an ink-jet system to spray conductive material onto the first electrode insulating layer 131a and the interconnecting wiring insulating layer 131c as indicated by dashed arrows, in a direction parallel to the central axis of the semiconductor chip 10. The second electrode 123 is also formed by using an ink-jet system to spray conductive material, as indicated by a dash-dotted arrow, onto the second electrode insulating layer 131b, also in the direction parallel to the central axis of the semiconductor chip 10.

The steps of forming the third and fourth dielectric layers 134, 135, redistribution wiring 140, metal posts 50, sealing layer 60, solder balls 70, and lands 80 on the upper and lower surfaces 10a, 10b of the semiconductor chip 10 and dicing the semiconductor chip 10 from the semiconductor wafer are the same as the corresponding steps in the method of fabricating the conventional semiconductor device 1.

Figure 9:
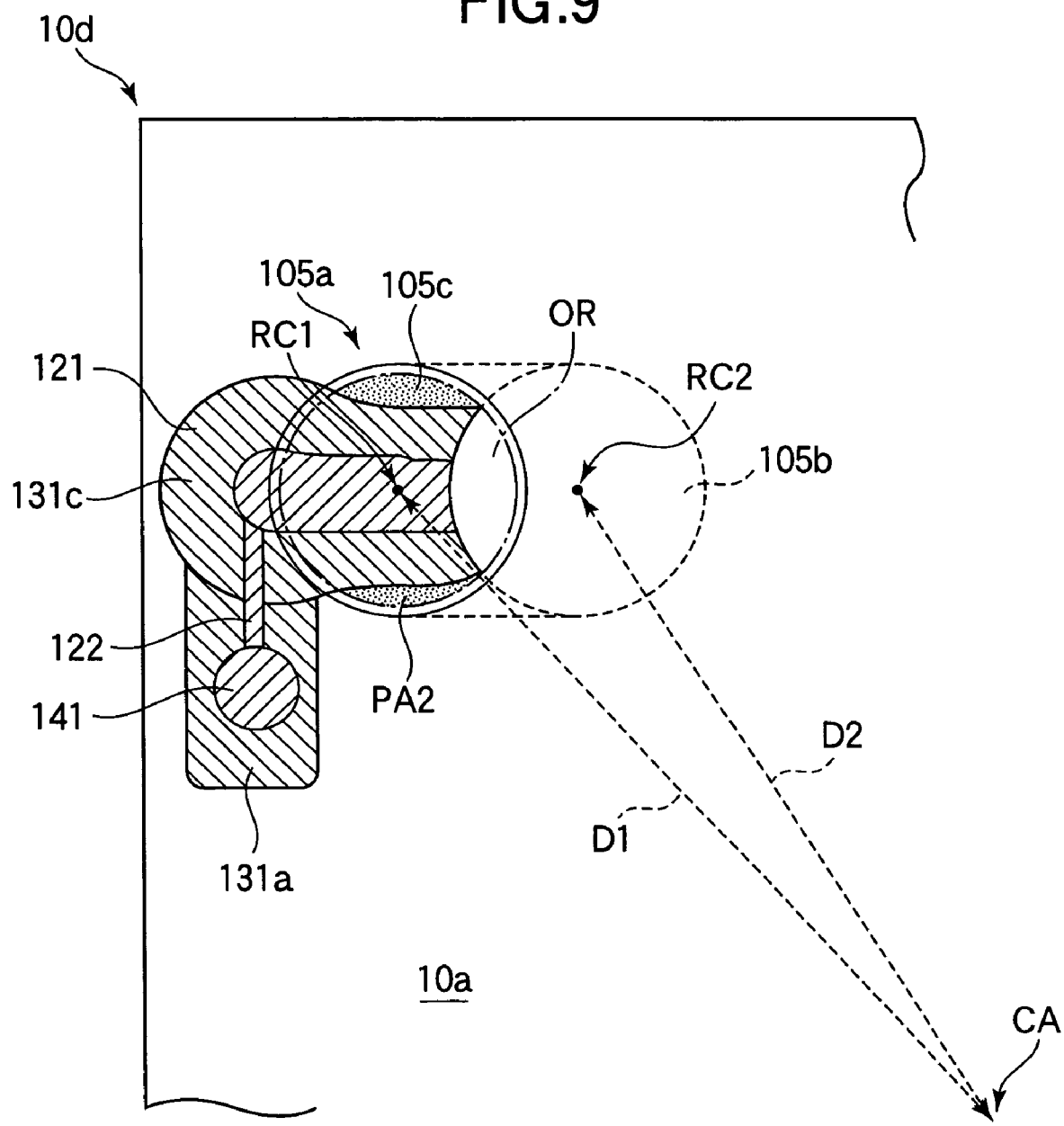
FIG. 9 is a top view of an inclined through hole.

FIG. 9 shows a plan view of the upper surface 10a of the semiconductor chip, schematically illustrating a second geometric projection PA2 of the first opening 105a of a through hole in a direction parallel to the central axis CA of the semiconductor chip 10 onto the inner wall 105c of the through hole. Also shown are the relevant parts of the interconnecting wiring 121, the interconnecting wiring insulating layer 131c, the first electrode 122, the first electrode insulating layer 131a, and the redistribution wiring 141 that makes electrical contact with the first electrode 122. The interconnecting wiring 121 extends to the second opening 105 because of the overlap OR noted in FIG. 6, that is, because the ink-jet system is able to 'see' the second opening 105b through the first opening 105a. The first dielectric layer 131 extends continuously from the upper surface 10a to the lower surface 10b, passing through at least part of the second projection PA2 on the inner wall 105c, for the same reason.

FIG. 9 also shows how the first electrode 222 and first electrode insulating layer 131a can be patterned to lead away from the first opening 105a of the through hole, so that the redistribution wiring 141 and third dielectric layer 134 (not shown) avoid the first opening 105a.

In addition, FIG. 9 shows that the distance D2 between the center RC2 of the second opening 105b and the central axis CA is shorter than the distance D1 between the center RC1 of the first opening 105a and the central axis CA. This distance relationship is a consequence of the increasing distance between the through holes and the edges of the semiconductor device as the through holds approach the lower surface 10b.

In the dicing process, cracks that start at the edges 10d of the lower surface 10b are less likely to propagate to the through holes 105, . . . , because of the increased distance of the through holes from those edges 10d, as compared with the conventional semiconductor device 1. The reliability of the through holes 105, . . . is enhanced accordingly.

The ink-jet system that forms the interconnecting wiring 121 has less of a tendency to form porosities than the electroplating system used in the conventional semiconductor device 1, so the electrical reliability of the interconnecting wiring 121 is also enhanced. In addition, it is comparatively easy to find ink-jet conditions that prevent porosities from forming in the interconnecting wiring 121, so the semiconductor device 100 also has an advantage over the conventional semiconductor device 1 in terms of fabrication cost.

Summary of Features (1) In the first embodiment, the through holes 105, . . . extend from the upper surface 10a to the lower surface 10b in a peripheral part of the semiconductor chip 10 inwardly adjacent to the edge. The through holes 105, . . . are separated from the central axis CA by a distance that diminishes as the through holes 105, . . . approach the lower surface 10b. Since the distance from the edge 10d of the lower surface 10b to the through holes 105, . . . increases as the through holes 105, . . . approach the lower surface 10b, the cracks forming at the edge 10d of the lower surface 10b are less likely to propagate to the through hole 105, . . . .

Since the cracks are less likely to propagate to the through hole 105, . . . as described above, the reliability of the through holes 105, . . . is enhanced.

(2) Part of the first geometric projection PA1 overlaps part of the second opening 105b (FIGS. 6 and 9). Accordingly, the interconnecting wiring insulating layer 131c and the interconnecting wiring 121 can be easily formed on part of the inner wall 105c by using an ink-jet system to spray dielectric material and conductive material onto the through holes 105, . . . in the direction from the upper surface 10a to the lower surface 10b parallel to the central axis CA.

(3) The conductive layers 120 formed on the first dielectric layer 131 extend continuously from the upper surface 10a to the lower surface 10b, passing through part of the second geometric projection PA2. Even if a plurality of the semiconductor devices 100 are laminated together, external signals can be supplied to upper and lower semiconductor devices 100 alike by forming electrodes (the first electrodes 122 and the second electrodes 123) on the upper surface 10a and the lower surface 10b.

(4) The through holes 105, . . . are formed in a peripheral part of the semiconductor chip 10 inwardly adjacent to the edge by directing a laser beam at an oblique angle onto the upper surface 10a. When the through holes 105, . . . are formed, accordingly, the likelihood of damage to the semiconductor chip 10 is reduced.

(5) The first dielectric layer 131 is formed by using an ink-jet system to spray dielectric material onto part of the second geometric projection PA2. Accordingly, the first dielectric layer 131 can be formed easily.

The conductive layers 120 and first dielectric layer 131 are formed by using an ink-jet system to spray conductive material and dielectric parallel to the central axis of the semiconductor chip 10. Accordingly, the conductive layers 120 can be formed more easily than would be possible if the through holes were parallel to the central axis and the ink-jet system had to be held at an angle.

Variations (A) Part of the first geometric projection PA1 shown in FIG. 9 may overlap the whole of the second opening 105b. In other words, the second opening 105b may coincide with the overlap OR. If the first dielectric layer 131 and the conductive layers 120 are then formed on part of the second geometric projection PA2, the distance from the edge 10d of the lower surface-10b to the first dielectric layer 131 and the conductive layers 120 increases as the through holes 105, . . . approach the lower surface 10b.

(B) The first dielectric layer 131 and the conductive layers 120 may be formed on the whole of the second geometric projection PA2. Since the first dielectric layer 131 and the conductive layers 120 can still be formed by using an ink-jet system, the first dielectric layer 131 and the conductive layers 120 can still be formed easily.

Second Embodiment

The semiconductor device in the second embodiment will be described with reference to FIGS. 10 to 16, focusing on the differences from the conventional semiconductor device, which are similar to the differences in the first embodiment except for further differences in the fabrication process.

Figure 10:
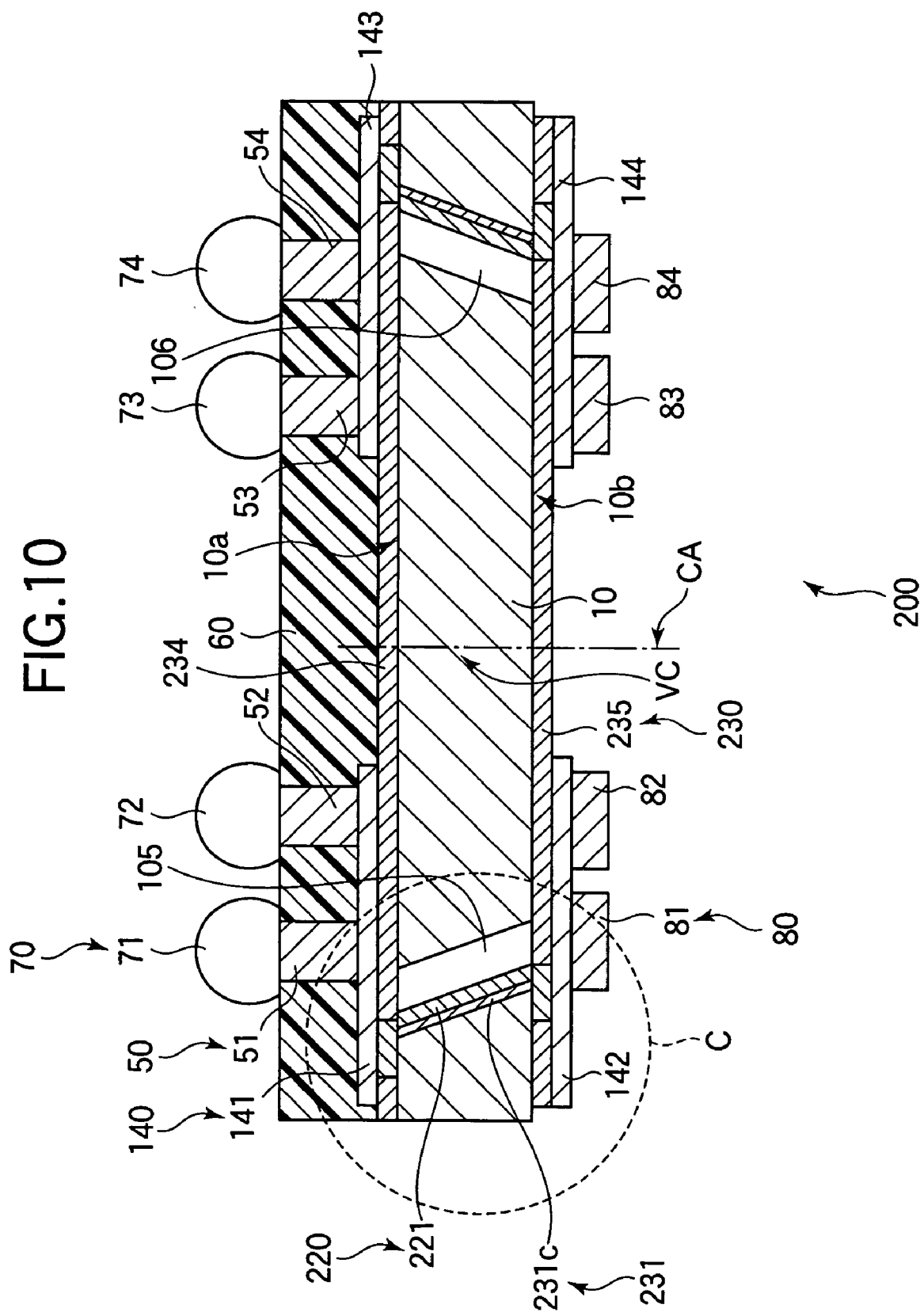
FIG. 10 is a sectional view of a semiconductor device in a second embodiment of the invention.

Referring to FIG. 10, the semiconductor device 200 in the second embodiment has through holes 105, 106, . . . , redistribution wiring 140, conductive layers 220, and first, third, and fourth dielectric layers 231, 234, 235 that differ in various aspects from the through holes 5, 6, . . . , redistribution wiring 40, conductive layers 20, and first, third, and fourth dielectric layers 31, 34, 35 of the conventional semiconductor device 1.

The third dielectric layer 234 extends across the upper surface 10a of the semiconductor chip 10. The first layer of redistribution wiring 141, 143, . . . extends parallel to the upper surface 10a of the semiconductor chip 10 on the surface of the third dielectric layer 234 distant from the semiconductor chip 10. The patterning of the third dielectric layer 234 and the patterning of the first layer of redistribution wiring 141, 143, . . . differ slightly from the patterning in the conventional semiconductor device 1.

The fourth dielectric layer 235 extends across the lower surface 10b of the semiconductor chip 10. The second layer of redistribution wiring 142, 144, . . . extends parallel to the lower surface 10b of the semiconductor chip 10 on the side of the fourth dielectric layer 235 distant from the semiconductor chip 10. The patterning of the fourth dielectric layer 235 and the patterning of the second layer of redistribution wiring 142, 144, . . . differ significantly from the patterning in the conventional semiconductor device 1.

The through holes 105, 106, . . . extend at an inclined angle from the upper surface 10a to the lower surface 10b in a peripheral part of the semiconductor chip 10 inwardly adjacent to its edge, and are separated from the central axis CA by a distance that diminishes as the through holes approach the lower surface 10b. If, for example, the distance between the upper surface 10a of the semiconductor chip 10 and the lower surface 10b is 50 µm, and the inner diameter of one of the through holes 105, . . . is 30 µm to 50 µm, then the through holes 105, . . . are preferably inclined at an angle of 25 degrees to 45 degrees with respect to the direction parallel to the central axis CA.

Figure 11:
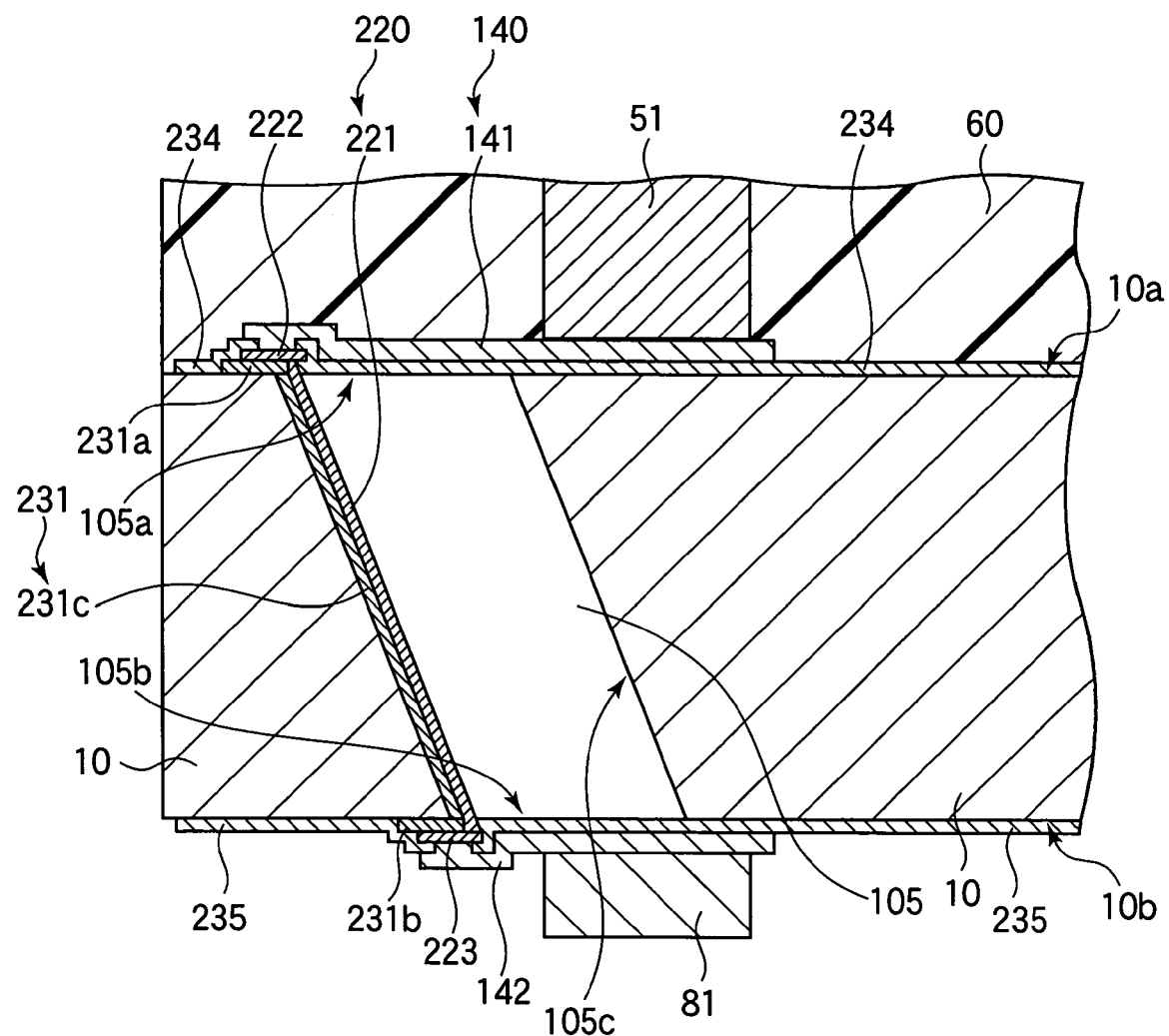
FIG. 11 is an enlarged sectional view of part C in FIG. 10.

Referring to FIG. 11, each of the through holes 105, . . . comprises chiefly a first opening 105a, a second opening 105b, and an inner wall 105c. Due to the inclined orientation of the through holes, the inner wall 105c is separated from the edge of the semiconductor chip 10 by a distance that increases as the inner wall 105c approaches the lower surface 10b.

The conductive layers 220 comprise interconnecting wiring 221, first electrodes 222, and second electrodes 223 that differ in location from the conventional interconnecting wiring 21, first electrodes 22, and second electrodes 23, although the general segmented channel shape is maintained. The interconnecting wiring 221 extends through each through hole 105, . . . from the upper surface 10a to the lower surface 10b of the semiconductor chip 10, but covers only part of the inside wall of each through hole 105, . . . , the covered part being a part that faces generally toward the edge of the semiconductor chip 10. The distance from the edge of the semiconductor chip 10 to the interconnecting wiring 221 increases as the interconnecting wiring 221 approaches the lower surface 10b. Each first electrode 222 parallels the upper surface 10a of the semiconductor chip 10; each second electrode 223 parallels the lower surface 10b of the semiconductor chip 10. The first electrodes 222 connect the interconnecting wiring 221 to the first layer of redistribution wiring 141, . . . ; the second electrodes 223 connect the interconnecting wiring 221 to the second layer of redistribution wiring 142, . . . .

The first dielectric layer 231 is interposed between the conductive layers 220 and the semiconductor chip 10. The first dielectric layer 231 comprises chiefly a first electrode insulating layer 231a, a second electrode insulating layer 231b, and an interconnecting wiring insulating layer 231c. The first electrode insulating layer 231a is interposed between the first electrodes 222 and the semiconductor chip 10. Accordingly, the first electrodes 222 are not electrically shorted to the semiconductor chip 10. The second electrode insulating layer 231b is interposed between the second electrodes 223 and the semiconductor chip 10. Accordingly, the second electrodes 223 are not electrically shorted to the semiconductor chip 10. The interconnecting wiring insulating layer 231c is interposed between the interconnecting wiring 221 and the semiconductor chip 10. Accordingly, the interconnecting wiring 221 is not electrically shorted to the semiconductor chip 10.

When a signal is supplied from metal post 51 through redistribution wiring 141 to the first electrode 222 in FIG. 11, the signal is transmitted from the first electrode 222 through the interconnecting wiring 221 to the second electrode 223 and thus to redistribution wiring 142. When a signal is supplied from land 81 through redistribution wiring 142 to the second electrode 223 in FIG. 11, the signal is transmitted from the second electrode 223 through the interconnecting wiring 221 to the first electrode 222, and thus to redistribution wiring 141. Signals can be therefore transmitted between the first layer of redistribution wiring 141, . . . and the second layer of redistribution wiring 142, . . . through the conductive layers 220.

A method of fabricating the semiconductor device in FIGS. 10 and 11 will now be described with reference to FIGS. 12 to 16.

The steps of preparing a semiconductor wafer and forming electronic circuit components are the same as the corresponding steps in the method of fabricating the conventional semiconductor device 1. As in the first embodiment, the initial lower surface of the wafer will be denoted by reference characters 10c.

Figure 12:
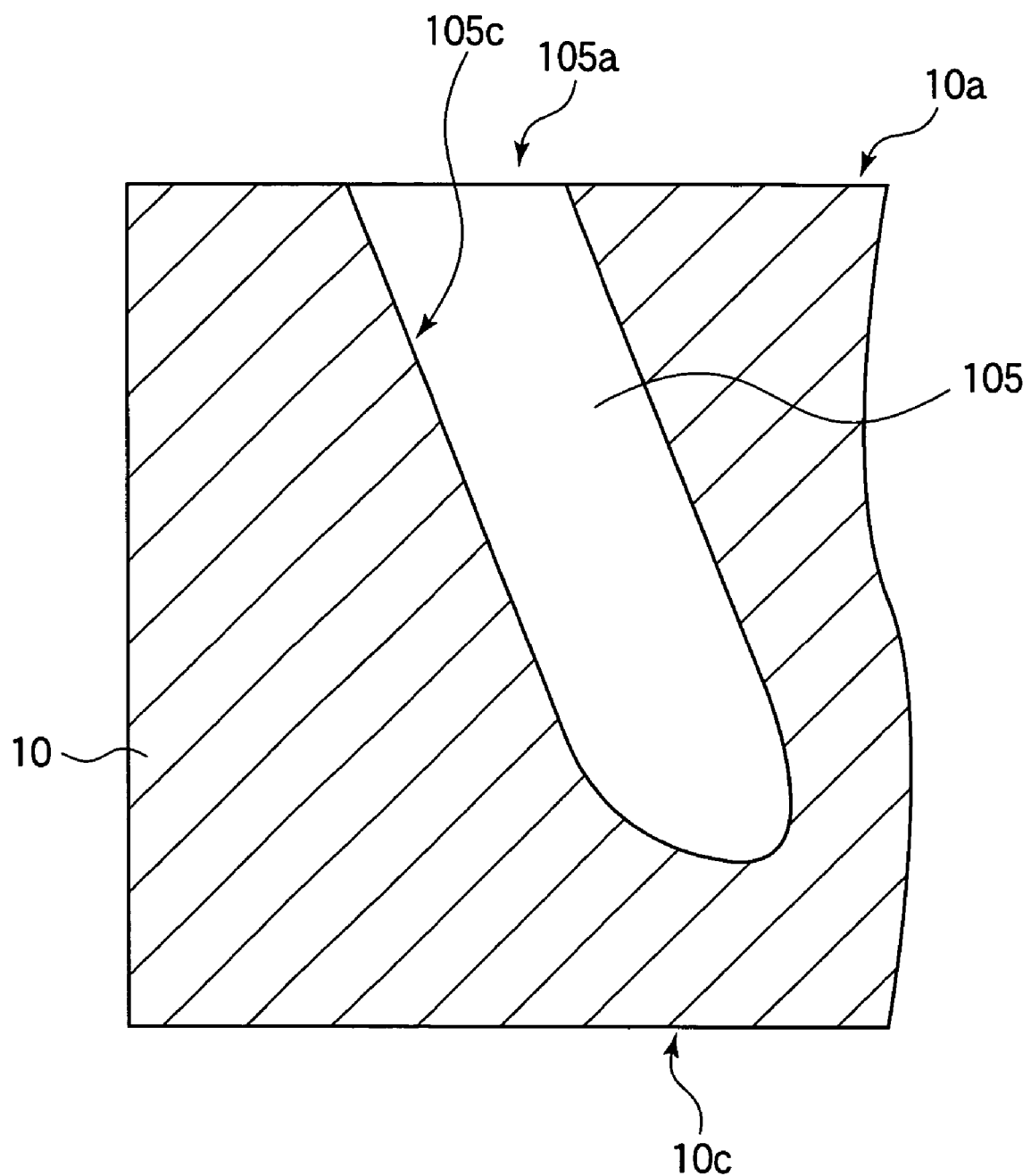
FIGS. 12, 13, 14, 15, and 16 are sectional views illustrating steps in a fabrication method for the semiconductor device in FIG. 10.

The through holes 105, . . . are formed as shown in FIG. 12 by directing a laser beam at an oblique angle onto the upper surface 10a of the semiconductor wafer. In this step, the through holes 105, . . . extend from the upper surface 10a to a depth HD less than the distance to the initial lower surface 10c.

Figure 13:
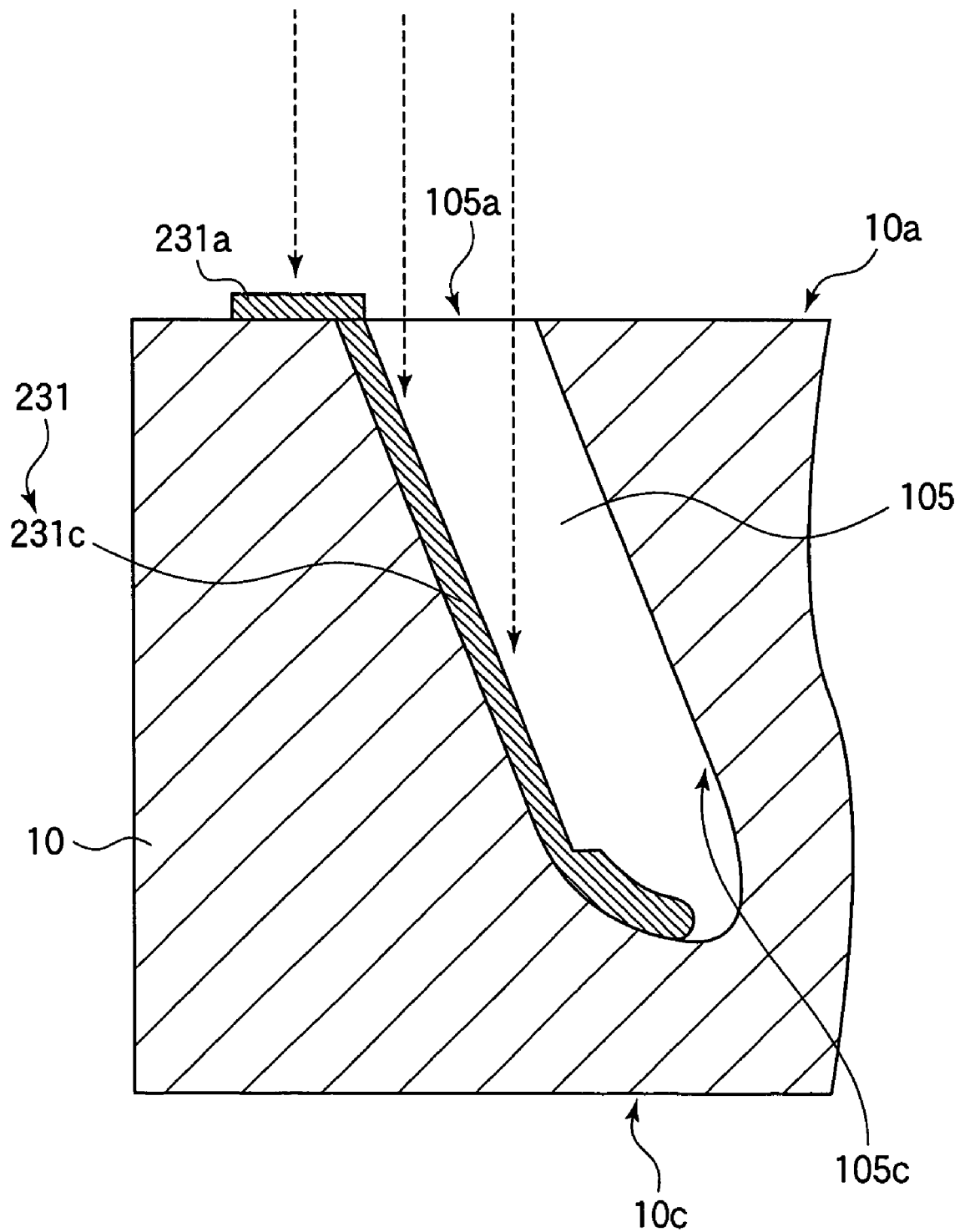

The first electrode insulating layer 231a and the interconnecting wiring insulating layer 231c of the first dielectric layer 231 are formed as shown in FIG. 13 by using an ink-jet system to spray dielectric material as indicated by dashed arrows, in the direction parallel to the central axis of the semiconductor chip 10, onto the upper surface 10a and part of the inner walls 105c of the through holes 105, . . . .

Figure 14:
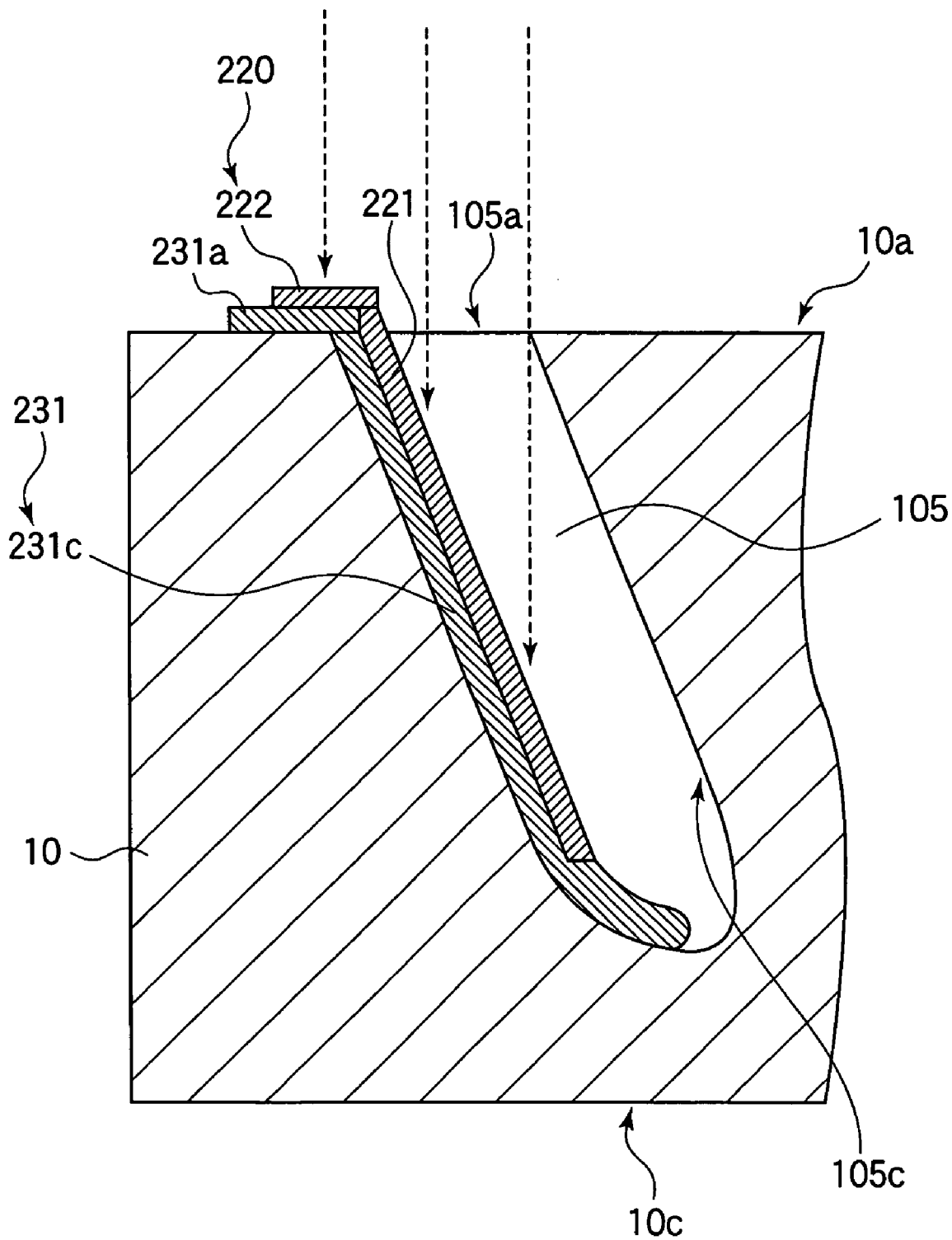

The first electrodes 222 and the interconnecting wiring 221 of the conductive layers 220 are formed as shown in FIG. 14, by using an ink-jet system to spray conductive material onto the first electrode insulating layer 231a and the interconnecting wiring insulating layer 231c as indicated by dashed arrows, in the direction parallel to the central axis of the semiconductor chip 10.

Figure 15:
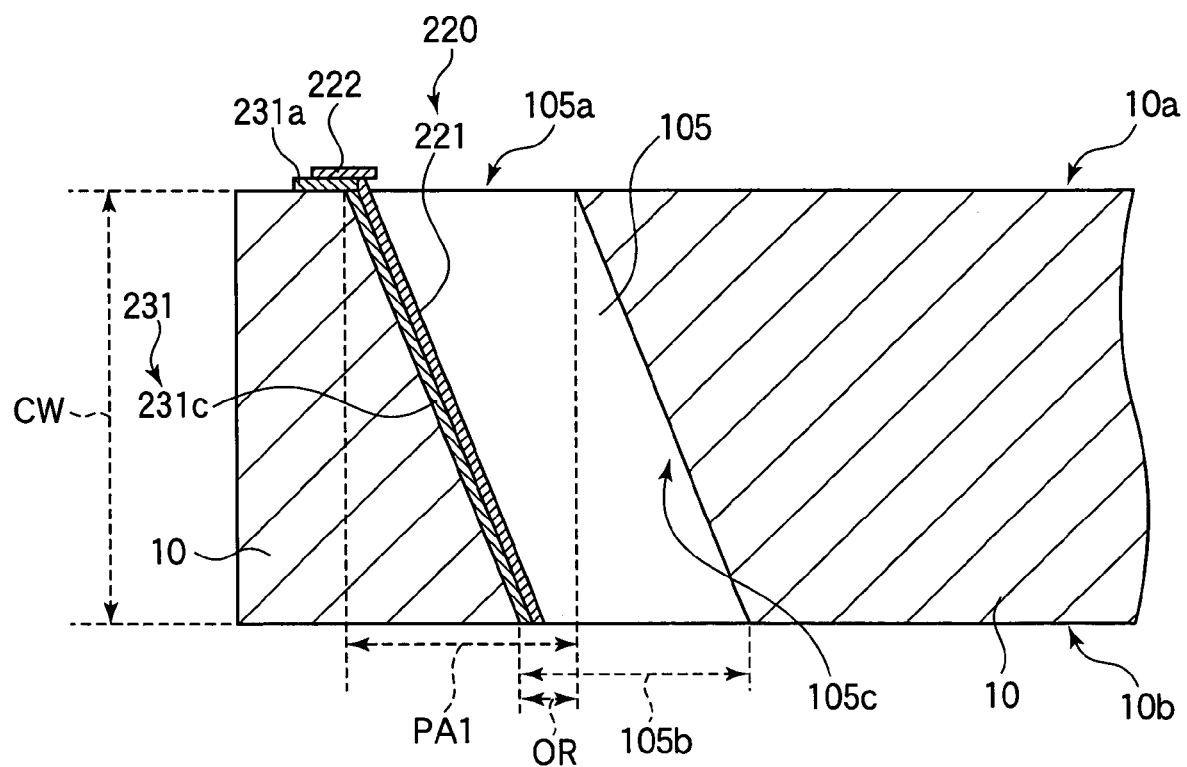

The initial lower surface 10c of the semiconductor wafer is then polished as shown in FIG. 15 to form the lower surface 10b that was shown in FIGS. 10 and 11. The distance CW between the upper surface 10a and lower surface 10b is less than the depth HD of the through holes in FIG. 12 (CW<HD), so the through holes 105, . . . extend from the upper surface 10a to the polished lower surface 10b. The through holes 105, . . . are also separated from the edges of the semiconductor chip 10 by a distance that increases as the through holes 105, . . . approach the lower surface 10b. Accordingly, if a first geometric projection PA1 is formed by projecting the first opening 105a onto the lower surface 10b parallel to the central axis of the semiconductor chip 10, the first geometric projection PA1 is generally closer to the edge of the semiconductor chip 10 than is the second opening 105b. Part of a first geometric projection PA1, however, overlaps part of the second opening 105b, as in the first embodiment. The overlap is designated by the reference characters OR.

Figure 16:
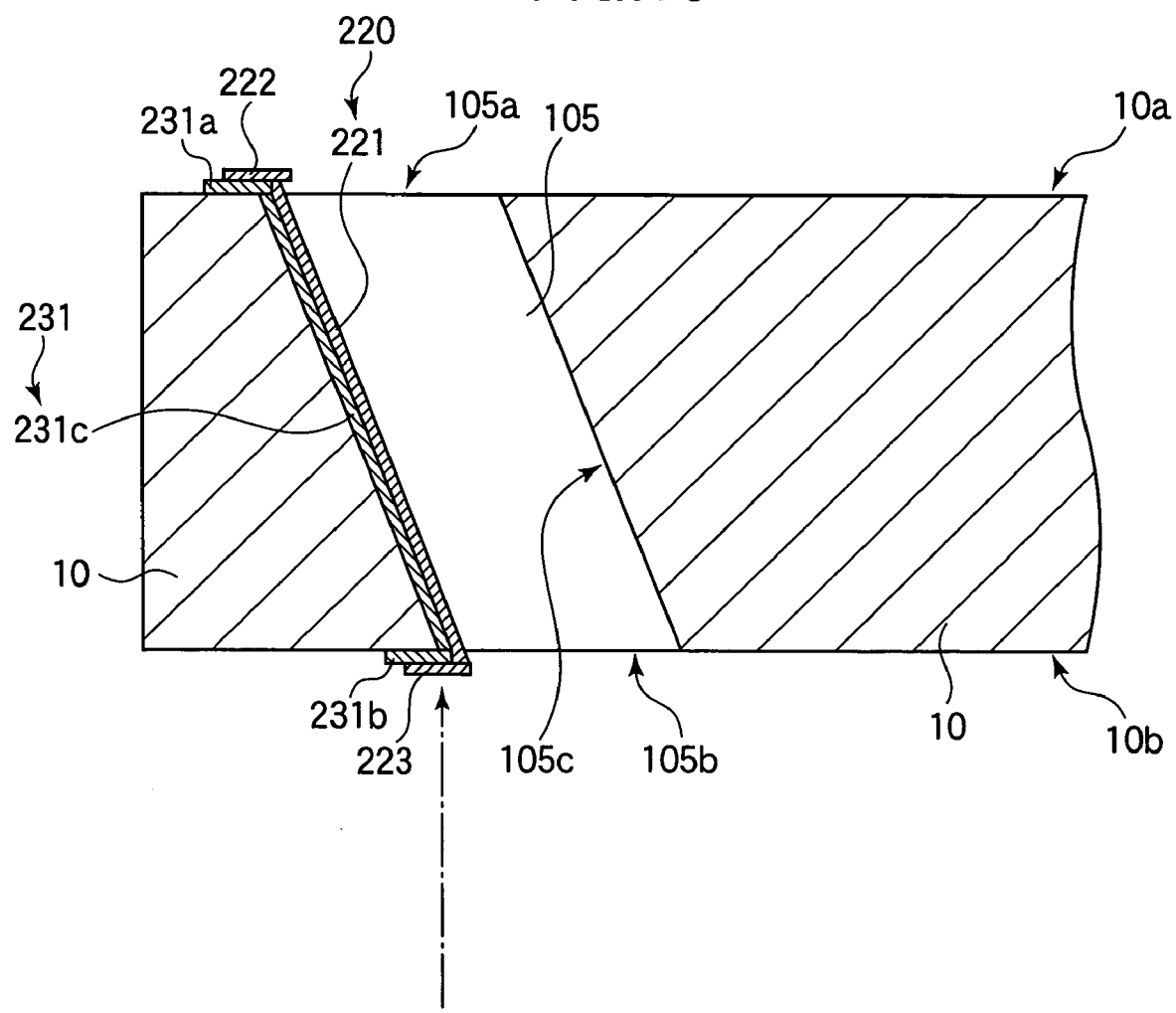

The second electrode insulating layer 231b of the first dielectric layer 231 is formed as shown in FIG. 16, by using an ink-jet system to spray dielectric material onto the lower surface 10b as indicated by a dash-dotted arrow, in the direction parallel to the central axis of the semiconductor chip 10.

The second electrodes 223 of the conductive layers 220 are formed as shown in FIG. 16, by using an ink-jet system to spray conductive material as indicated by a dash-dotted arrow onto the second electrode insulating layer 231b, in the direction parallel to the central axis of the semiconductor chip 10.

The steps of forming the third and fourth dielectric layers 234, 235, redistribution wiring 140, metal posts 50, sealing layer 60, solder balls 70, and lands 80 on the upper and lower surfaces 10a, 10b of the semiconductor chip 10 and dicing the semiconductor chip 10 from the semiconductor wafer are the same as the corresponding steps in the method of fabricating the conventional semiconductor device 1.

In the dicing process, cracks that start at the edges 10d of the lower surface 10b are less likely to propagate to the through holes 105, . . . , because of the increased distance of the through holes from those edges 10d, as compared with the conventional semiconductor device 1. The reliability of the through holes 105, . . . is enhanced accordingly.

The ink-jet system that forms the interconnecting wiring 221 has less of a tendency to form porosities than the electroplating system used in the conventional semiconductor device 1, so the electrical reliability of the interconnecting wiring 221 is also enhanced. In addition, it is comparatively easy to find ink-jet conditions that prevent porosities from forming in the interconnecting wiring 221, so the semiconductor device 100 also has an advantage over the conventional semiconductor device 1 in terms of fabrication cost.

Summary of Features (1) In the second embodiment, the through holes 105, . . . extend from the upper surface 10a to the lower surface 10b in a peripheral part of the semiconductor chip 10 inwardly adjacent to the edge. The through holes 105, . . . are separated from the central axis CA by a distance that diminishes as the through holes 105, . . . approach the lower surface 10b. Since the distance from the edges 10d of the lower surface 10b to the through holes 105, . . . increases as the through holes 105, . . . approach the lower surface 10b, the cracks forming at the edges 10d of the lower surface 10b are less likely to propagate to the through hole 105, . . . .

Since the cracks are less likely to propagate to the through hole 105, . . . as described above, the reliability of the through holes 105, . . . is enhanced.

(2) Part of the first geometric projection PA1 overlaps part of the second opening 105b (FIG. 15). Accordingly, the interconnecting wiring insulating layer 231c and the interconnecting wiring 221 can be easily formed on part of the inner wall 105c by using an ink-jet system to spray dielectric material and conductive material onto the through holes 105, . . . in the direction from the upper surface 10a to the lower surface 10b parallel to the central axis CA.

(3) The conductive layers 220 formed on the first dielectric layer 231 extend continuously from the upper surface 10a to the lower surface 10b. Even if a plurality of the semiconductor devices 200 are stacked one atop another, external signals can be supplied to upper and lower semiconductor devices 200 alike by forming electrodes (the first electrodes 222 and the second electrodes 223) on the upper surface 10a and the lower surface 10b.

(4) The through holes 105, . . . are formed in a peripheral part of the semiconductor chip 10 inwardly adjacent to the edge by directing a laser beam at an oblique angle onto the upper surface 10a. When the through holes 105, . . . are formed, accordingly, the likelihood of damage to the semiconductor chip 10 is reduced.

(5) When dielectric material is sprayed onto part of the inner walls 105c of the through holes 105, . . . in the step of using an ink-jet system to form the first electrode insulating layer 231a and the interconnecting wiring insulating layer 231c, none of the sprayed dielectric material can emerge on the underside of the wafer, since the through holes do not yet extend through the wafer. Similarly, when conductive material is sprayed onto part of the inner walls 105c of the through holes 105, . . . in the step of using an ink-jet system to form the first electrodes 222 and the interconnecting wiring 221, none of the sprayed conductive material can emerge on the underside of the wafer. Accordingly, the conductive layers 220 and first dielectric layer 231 can be formed more easily than in the first embodiment.

As in the first embodiment, the conductive layers 220 and first dielectric layer 231 are formed by using an ink-jet system to spray conductive material parallel to the central axis of the semiconductor chip 10, simplifying control of the spraying process.

Third Embodiment

The semiconductor device in the third embodiment will be described with reference to FIGS. 17 to 21, focusing on the differences from the conventional semiconductor device.

Figure 17:
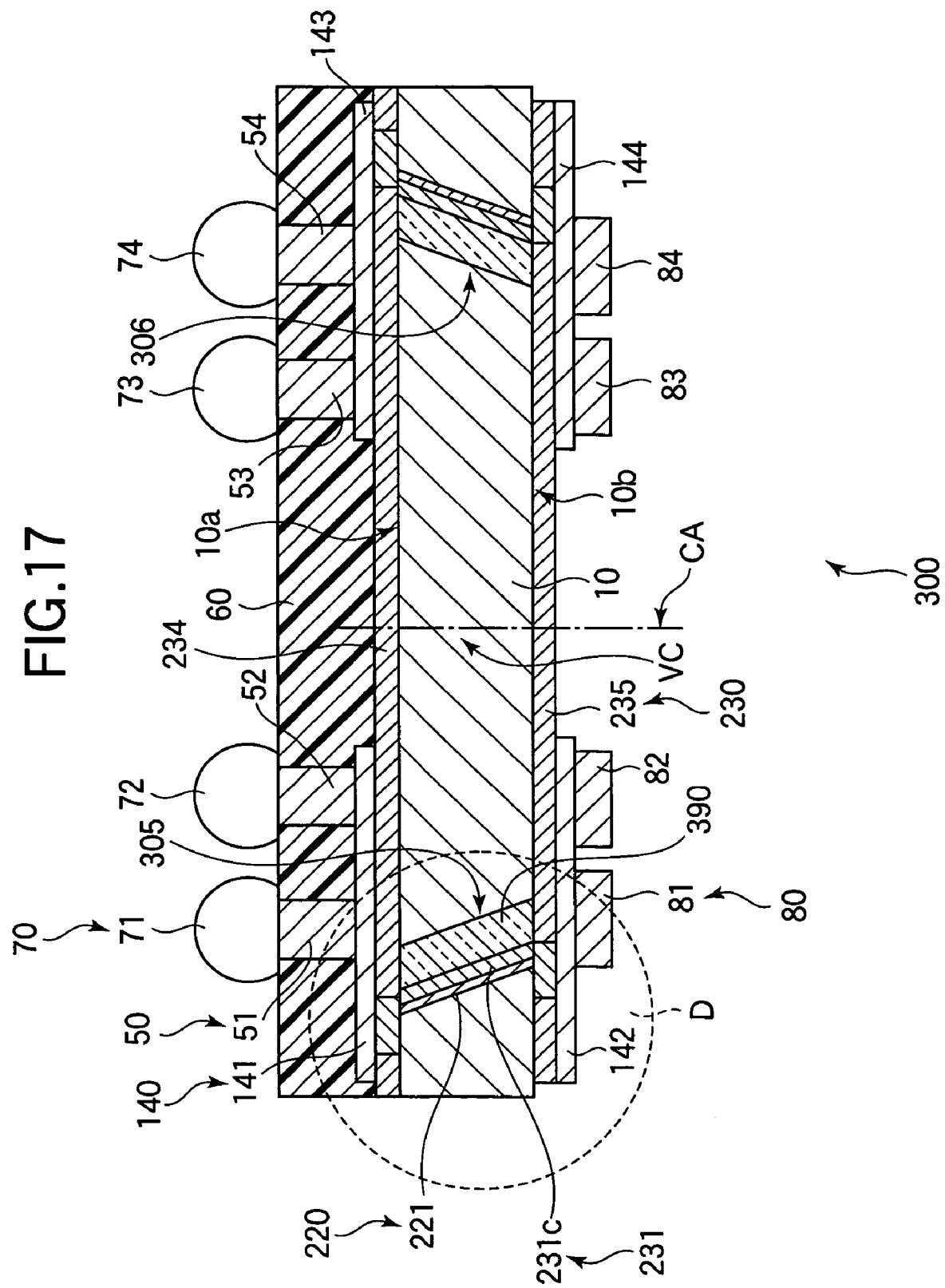
FIG. 17 is a sectional view of a semiconductor device in a third embodiment of the invention.

Referring to FIG. 17, the semiconductor device 300 in the third embodiment has redistribution wiring 140, conductive layers 220, first, third, and fourth dielectric layers 231, 234, 235, and through holes 305, 306, . . . that differ in various aspects from the redistribution wiring 40, conductive layers 20, first, third, and fourth dielectric layers 31, 34, 35, and through holes 5, 6, . . . of the conventional semiconductor device 1. In addition, the third embodiment has a second dielectric layer 390.

The third dielectric layer 234 extends across the upper surface 10a of the semiconductor chip 10. The first layer of redistribution wiring 141, 143, . . . extends parallel to the upper surface 10a of the semiconductor chip 10 on the surface of the third dielectric layer 234 distant from the semiconductor chip 10. The patterning of the third dielectric layer 134 and the patterning of the first layer of redistribution wiring 141, 143, . . . may differ from the patterning in the preceding embodiments as well as from the patterning in the conventional semiconductor device 1.

The fourth dielectric layer 235 extends across the lower surface 10b of the semiconductor chip 10. The second layer of redistribution wiring 142, 144, . . . extends parallel to the lower surface 10b of the semiconductor chip 10 on the side of the fourth dielectric layer 235 distant from the semiconductor chip 10. The patterning of the fourth dielectric layer 135 and the patterning of the second layer of redistribution wiring 142, 144, . . . differ significantly from the patterning in the conventional semiconductor device 1, and may also differ from the patterning in the preceding embodiments.

The through holes 305, 306, . . . extend at an inclined angle from the upper surface 10a to the lower surface 10b in a peripheral part of the semiconductor chip 10 inwardly adjacent to its edge, and are separated from the central axis CA by a distance that diminishes as the through holes approach the lower surface 10b. If, for example, the distance between the upper surface 10a of the semiconductor chip 10 and the lower surface 10b is 50 μm, and the inner diameter of one of the through holes 105, . . . is 30 μm to 50 μm, then the through holes 305, . . . are preferably inclined at an angle of 25 degrees to 45 degrees with respect to the direction parallel to the central axis CA.

Figure 18:
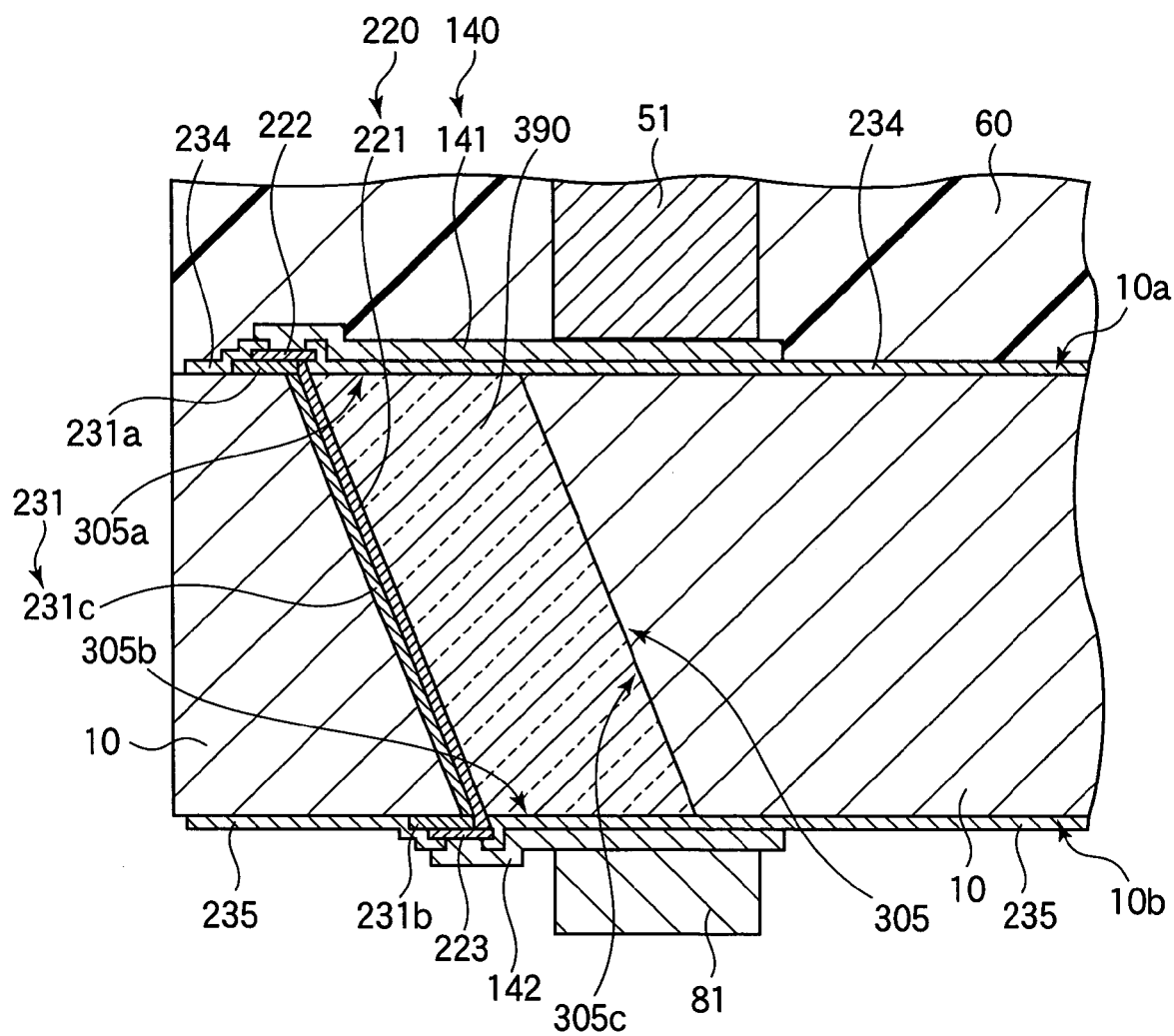
FIG. 18 is an enlarged sectional view of part D in FIG. 17.

Referring to FIG. 18, each of the through holes 305, . . . comprises chiefly a first opening 305a, a second opening 305b, and an inner wall 305c. Due to the inclined orientation of the through holes, the inner wall 305c is separated from the edge of the semiconductor chip 10 by a distance that increases as the inner wall 305c approaches the lower surface 10b.

The conductive layers 220 comprise interconnecting wiring 221, first electrodes 222, and second electrodes 223 that differ in location from the conventional interconnecting wiring 21, first electrodes 22, and second electrodes 23, although the general segmented channel shape is maintained. The interconnecting wiring 221 extends through each through hole 105, . . . from the upper surface 10a to the lower surface 10b of the semiconductor chip 10, but covers only part of the inside wall of each through hole 105, . . . , the covered part being a part that faces generally toward the edge of the semiconductor chip 10. The distance from the edge of the semiconductor chip 10 to the interconnecting wiring 221 increases as the interconnecting wiring 221 approaches the lower surface 10b. Each first electrode 222 parallels the upper surface 10a of the semiconductor chip 10; each second electrode 223 parallels the lower surface 10b of the semiconductor chip 10. The first electrodes 222 connect the interconnecting wiring 221 to the first layer of redistribution wiring 141, . . . ; the second electrodes 223 connect the interconnecting wiring 221 to the second layer of redistribution wiring 142, . . . .

The first dielectric layer 231 is interposed between the conductive layers 220 and the semiconductor chip 10. The first dielectric layer 231 comprises chiefly a first electrode insulating layer 231a, a second electrode insulating layer 231b, and an interconnecting wiring insulating layer 231c. The first electrode insulating layer 231a is interposed between the first electrodes 222 and the semiconductor chip 10. Accordingly, the first electrodes 222 are not electrically shorted to the semiconductor chip 10. The second electrode insulating layer 231b is interposed between the second electrodes 223 and the semiconductor chip 10. Accordingly, the second electrodes 223 are not electrically shorted to the semiconductor chip 10. The interconnecting wiring insulating layer 231c is interposed between the interconnecting wiring 221 and the semiconductor chip 10. Accordingly, the interconnecting wiring 221 is not electrically shorted to the semiconductor chip 10.

The second dielectric layer 390 is formed on the first dielectric layer 231 and the conductive layers 220 so as to fill in the through holes 305, . . . .

When a signal is supplied from metal post 51 through redistribution wiring 141 to the first electrode 222 in FIG. 18, the signal is transmitted from the first electrode 222 through the interconnecting wiring 221 to the second electrode 223 and thus to redistribution wiring 142. When a signal is supplied from land 81 through redistribution wiring 142 to the second electrode 223 in FIG. 18, the signal is transmitted from the second electrode 223 through the interconnecting wiring 221 to the first electrode 222, and thus to redistribution wiring 141. Signals can be therefore transmitted between the first layer of redistribution wiring 141, . . . and the second layer of redistribution wiring 142, . . . through the conductive layers 220.

A method of fabricating the semiconductor device in FIGS. 17 and 18 will now be described with reference to FIGS. 12 to 14 and 19 to 21.

The steps of preparing a semiconductor wafer and forming electronic circuit components are the same as the corresponding steps in the method of fabricating the conventional semiconductor device 1. As in the preceding embodiments, the initial lower surface of the wafer will be denoted by reference characters 10c.

The through holes 305, . . . are formed in the same way as the through holes 105, . . . shown in FIG. 12, by directing a laser beam at an oblique angle onto the upper surface 10a of the semiconductor wafer. In this step, the through holes extend from the upper surface 10a to a depth HD less than the distance to the initial lower surface 10c.

The first electrode insulating layer 231a and the interconnecting wiring insulating layer 231c of the first dielectric layer 231 are formed as in the second embodiment, by using an ink-jet system to spray dielectric material as indicated by dashed arrows in FIG. 13, in the direction parallel to the central axis of the semiconductor chip 10, onto the upper surface 10a and part of the inner walls 305c of the through holes 305, . . . .

The first electrodes 222 and the interconnecting wiring 221 of the conductive layers 220 are formed as in the second embodiment, by using an ink-jet system to spray conductive material onto the first electrode insulating layer 231a and the interconnecting wiring insulating layer 231c as indicated by dashed arrows in FIG. 14, in the direction parallel to the central axis of the semiconductor chip 10.

Figure 19:
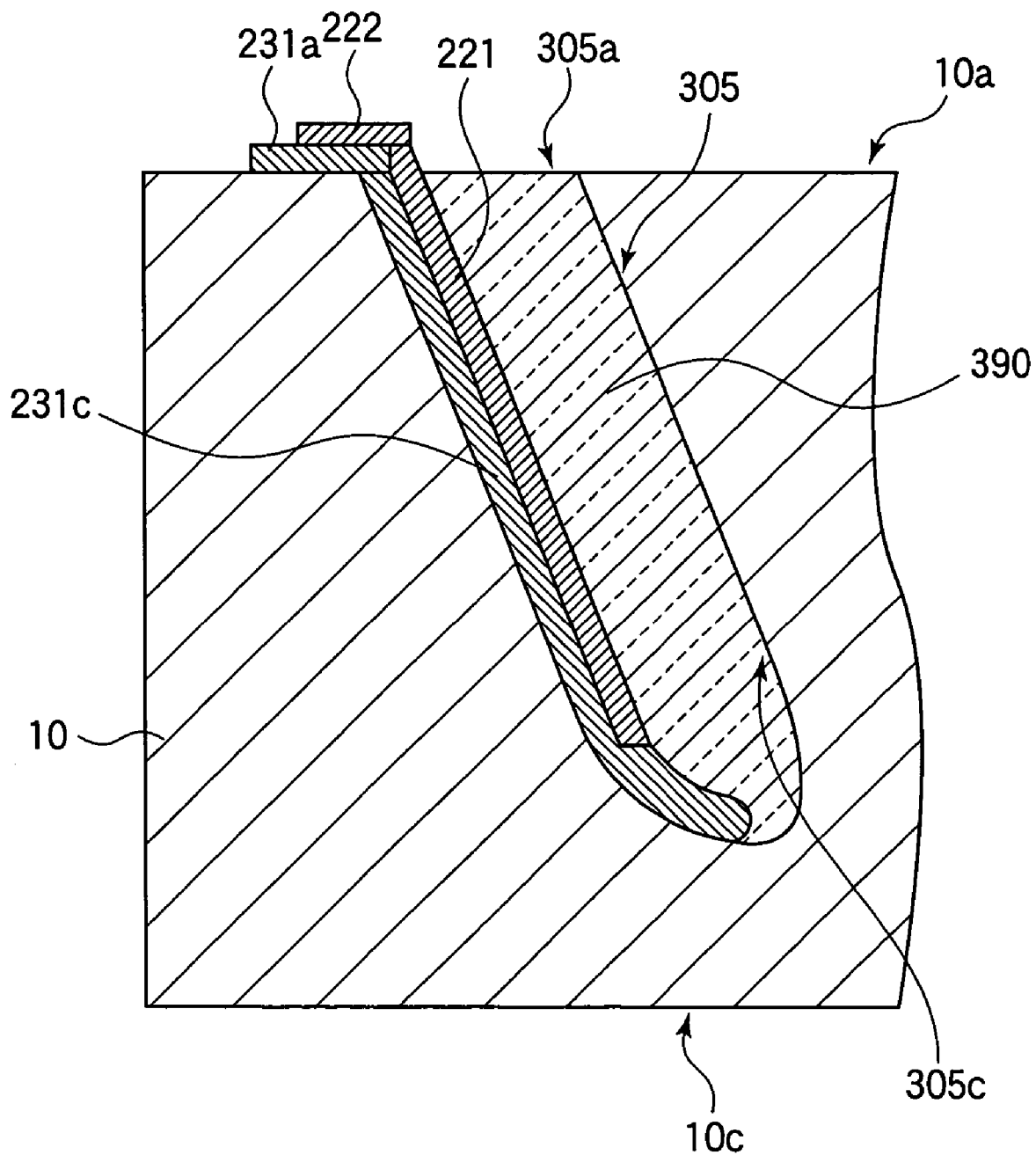

The second dielectric layer 390 is formed as shown in FIG. 19 by depositing dielectric material on the interconnecting wiring insulating layer 231c and the interconnecting wiring 221 by CVD so as to fill in the through holes 305, . . . .

The initial lower surface 10c of the semiconductor wafer is then polished as shown in FIG. 20 to form the lower surface 10b that was shown in FIGS. 17 and 18. The distance CW between the upper surface 10a and lower surface 10b is less than the depth HD of the through holes in FIG. 12 (CW<HD), so the through holes 305, . . . extend from the upper surface 10a to the polished lower surface 10b. The through holes 305, . . . are also separated from the edges of the semiconductor chip 10 by a distance that increases as the through holes 305, . . . approach the lower surface 10b. Accordingly, if a first geometric projection PA1 is formed by projecting the first opening 305a onto the lower surface 10b parallel to the central axis of the semiconductor chip 10, the first geometric projection PA1 is generally closer to the edge of the semiconductor chip 10 than is the second opening 305b. Part of a first geometric projection PA1, however, overlaps part of the second opening 305b. The overlap is designated by the reference characters OR, as in the preceding embodiments.

The second electrode insulating layer 231b of the first dielectric layer 231 is formed as shown in FIG. 21, by using an ink-jet system to spray dielectric material onto the lower surface 10b as indicated by a dash-dotted arrow, in the direction parallel to the central axis of the semiconductor chip 10.

The second electrodes 223 of the conductive layers 220 are formed as shown in FIG. 21, by using an ink-jet system to spray conductive material as indicated by a dash-dotted arrow onto the second electrode insulating layer 231b, in the direction parallel to the central axis of the semiconductor chip 10.

The steps of forming the third and fourth dielectric layers 234, 235, redistribution wiring 140, metal posts 50, sealing layer 60, solder balls 70, and lands 80 on the upper and lower surfaces 10a, 10b of the semiconductor chip 10 and dicing the semiconductor chip 10 from the semiconductor wafer are the same as the corresponding steps in the method of fabricating the conventional semiconductor device 1.

In the dicing process, cracks that start at the edges 10d of the lower surface 10b are less likely to propagate to the through holes 305, . . . , because of the increased distance of the through holes from those edges 10d, as compared with the conventional semiconductor device 1. The reliability of the through holes 305, . . . is enhanced accordingly.

The ink-jet system that forms the interconnecting wiring 221 has less of a tendency to form porosities than the electroplating system used in the conventional semiconductor device 1, so the electrical reliability of the interconnecting wiring 221 is also enhanced. In addition, it is comparatively easy to find ink-jet conditions that prevent porosities from forming in the interconnecting wiring 221, so the semiconductor device 100 also has an advantage over the conventional semiconductor device 1 in terms of fabrication cost.

Compared with the preceding embodiments, the third embodiment has the advantage that the first and second electrodes 222, 223, their insulating layers 231a, 231b, and the redistribution wiring 40 need not be routed away from the through holes 305, . . . , because the through holes 305, . . . are filled in the by the second dielectric layer 390.

Summary of Features (1) In the third embodiment, the through holes 305, . . . extend from the upper surface 10a to the lower surface 10b in a peripheral part of the semiconductor chip 10 inwardly adjacent to the edge. The through holes 305, . . . are separated from the central axis CA by a distance that diminishes as the through holes 305, . . . approach the lower surface 10b. Since the distance from the edges 10d of the lower surface 10b to the through holes 305, . . . increases as the through holes 305, . . . approach the lower surface 10b, the cracks forming at the edges 10d of the lower surface 10b are less likely to propagate to the through hole 305, . . . .

Since the cracks are less likely to propagate to the through hole 305, . . . as described above, the reliability of the through holes 305, . . . is enhanced.

(2) Part of the first geometric projection PA1 overlaps part of the second opening 305b (FIG. 20). Accordingly, the interconnecting wiring insulating layer 231c and the interconnecting wiring 221 can be easily formed on part of the inner wall 305c by using an ink-jet system to spray dielectric material and conductive material onto the through holes 305, . . . in the direction from the upper surface 10a to the lower surface 10b parallel to the central axis CA.

(3) The conductive layers 220 formed on the first dielectric layer 231 extend continuously from the upper surface 10a to the lower surface 10b. Even if a plurality of the semiconductor devices 300 are stacked one atop another, external signals are supplied to upper and lower semiconductor devices 300 alike by forming electrodes (the first electrodes 222 and the second electrodes 223) on the upper surface 10a and the lower surface 10b.

(4) The through holes 305, . . . are formed in a peripheral part of the semiconductor chip 10 inwardly adjacent to the edge by directing a laser beam at an oblique angle onto the upper surface 10a. When the through holes 305, . . . are formed, accordingly, the likelihood of damage to the semiconductor chip 10 is reduced.

(5) In the steps of forming the first electrode insulating layer 231a, the interconnecting wiring insulating layer 231c, the first electrodes 222, and the interconnecting wiring 221 by using an ink-jet system to spray dielectric material and conductive material toward the top surface 10a, control of the spraying process is simplified, as in the second embodiment, because none of the sprayed material can emerge from the lower surface 10b of the wafer. In these steps and the step of forming the second electrode insulating layer 231b, the ink-jet system can also be controlled easily because, as in the preceding embodiments, the material is sprayed parallel to the central axis of the semiconductor chip 10.

(6) The second dielectric layer 390 is formed on the interconnecting wiring insulating layer 231c and the interconnecting wiring 221 so as to fill in the through holes 305, . . . . Accordingly, the interconnecting wiring insulating layer 231c and the interconnecting wiring 221 are protected during the subsequent formation of the third and fourth dielectric layers 234, 235, redistribution wiring 40, metal posts 50, sealing layer 60, and lands 80.

The invention is not limited to the embodiments described above. Those skilled in the art will recognize that further variations are possible within the scope of the invention, which is defined in the appended claims.

What is claimed is:

1. A semiconductor device comprising:
    a semiconductor substrate having a center of volume, a central axis passing through the center of volume, a first surface extending substantially orthogonal to the central axis, electronic circuitry formed on the first surface, a second surface extending substantially orthogonal to the central axis, an edge extending substantially parallel to the central axis from the first surface to the second surface, and a peripheral part inwardly adjacent to the edge, wherein:
    the peripheral part has a through hole extending from the first surface to the second surface, the through hole providing an electrical connection between the first and second surfaces, the through hole originating at a first opening on the first surface and terminating at a second opening on the second surface, a distance of the second opening from the edge being larger than a distance of the first opening from the edge, a geometric projection formed by projecting the first opening onto the second surface parallel to the central axis being disposed partly inside and partly outside the second opening, the second opening being partly inside and partly outside the geometric projection.

2. The semiconductor device of claim 1, wherein the through hole is inclined at an angle of at least twenty-five degrees with respect to the central axis.

3. The semiconductor device of claim 1, wherein the through hole is inclined at an angle of at most forty-five degrees with respect to the central axis.

4. The semiconductor device of claim 1, wherein the through hole has an inner diameter of at least thirty micrometers.

5. The semiconductor device of claim 1, wherein the through hole has an inner diameter of at most fifty micrometers.

6. The semiconductor device of claim 1, wherein the upper surface and lower surface of the semiconductor substrate are mutually separated by a distance of substantially fifty micrometers.

7. The semiconductor device of claim 1, wherein the semiconductor device has a chip scale package.

8. The semiconductor device of claim 1, wherein the semiconductor device has a wafer level chip scale package.

9. The semiconductor device of claim 1, wherein the electronic circuitry includes source areas, drain areas, and gate electrodes.

10. The semiconductor device of claim 9, further comprising a first electrode formed on the first surface, a second electrode formed on the second surface, and a conductive layer formed in the through hole to interconnect the first and second electrodes.

11. The semiconductor device of claim 1, further comprising a first electrode formed on the first surface, a second electrode formed on the second surface, and a conductive layer formed in the through hole to interconnect the first and second electrodes.

12. A semiconductor device comprising:
    a semiconductor substrate having a center of volume, a central axis passing through the center of volume, a first surface extending substantially orthogonal to the central axis, electronic circuitry formed on the first surface, a second surface extending substantially orthogonal to the central axis, an edge extending substantially parallel to the central axis from the first surface to the second surface, and a peripheral part inwardly adjacent to the edge, wherein:
    the peripheral part has a through hole extending from the first surface to the second surface, the through hole being separated from the central axis by a distance that diminishes as the through hole approaches the second surface;
    the through hole originates in a first opening on the first surface and terminates in a second opening on the second surface, and has an inner wall extending from the first opening to the second opening;
    a first geometric projection, formed by projecting the first opening onto the second surface parallel to the central axis, overlaps at least part of the second opening;
    a first dielectric layer extending continuously from the first surface to the second surface on at least part of the inner wall of the through hole, passing through at least part of a second geometric projection formed by projecting the first opening parallel to the central axis onto the inner wall; and
    a conductive layer formed on the first dielectric layer, extending continuously from the first surface to the second surface, passing through at least part of the second geometric projection.

13. The semiconductor device of claim 12, wherein the first dielectric layer is a sprayed layer of dielectric material.

14. The semiconductor device of claim 12, wherein the conductive layer is a sprayed layer of conductive material.

15. The semiconductor device of claim 12, further comprising:

a second dielectric layer formed on the first dielectric layer and the conductive layer, the second dielectric layer filling the through hole.

16. The semiconductor device of claim 12, further comprising:

a first layer of redistribution wiring disposed on the upper surface of the semiconductor substrate, electrically connected to the conductive layer; and a second layer of redistribution wiring disposed on the lower surface of the semiconductor substrate, electrically connected to the conductive layer.

17. The semiconductor device of claim 16, wherein the conductive layer includes an electrode disposed on the first surface of the semiconductor substrate, the electrode leading away from the through hole, the first layer of redistribution wiring being electrically connected to the electrode, the first layer of redistribution wiring being routed to avoid the through hole.

* * * * *